(12) United States Patent
Song et al.

(10) Patent No.: US 9,972,639 B2
(45) Date of Patent: May 15, 2018

(54) SEMICONDUCTOR DEVICE COMPRISING A CONDUCTIVE LAYER HAVING AN AIR GAP

(71) Applicants: Ju Hak Song, Hwaseong-si (KR); Seon Kyung Kim, Hwaseong-si (KR)

(72) Inventors: Ju Hak Song, Hwaseong-si (KR); Seon Kyung Kim, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days. days.

(21) Appl. No.: 15/066,415

(22) Filed: Mar. 10, 2016

(65) Prior Publication Data

US 2016/0336340 A1 Nov. 17, 2016

(30) Foreign Application Priority Data

May 12, 2015 (KR) ........................ 10-2015-0066325

(51) Int. Cl.
*H01L 29/76* (2006.01)
*H01L 27/11582* (2017.01)
*H01L 23/532* (2006.01)
*H01L 23/485* (2006.01)
*H01L 21/764* (2006.01)
*H01L 27/11556* (2017.01)
*H01L 23/522* (2006.01)

(52) U.S. Cl.
CPC ...... *H01L 27/11582* (2013.01); *H01L 21/764* (2013.01); *H01L 23/485* (2013.01); *H01L 23/5329* (2013.01); *H01L 23/5226* (2013.01); *H01L 27/11556* (2013.01)

(58) Field of Classification Search
CPC ............. H01L 21/683; H01L 27/11582; H01L 21/764; H01L 23/485; H01L 23/5329; H01L 23/5226; H01L 27/11556; G01R 31/28

See application file for complete search history.

(56) References Cited

U.S. PATENT DOCUMENTS

| | | | |
|---|---|---|---|
| 7,679,133 | B2 | 3/2010 | Son et al. |
| 8,390,055 | B2 | 3/2013 | Higashi et al. |
| 8,553,466 | B2 | 10/2013 | Han et al. |
| 8,559,235 | B2 | 10/2013 | Yoon et al. |
| 8,653,585 | B2 | 2/2014 | Youm et al. |
| 8,654,587 | B2 | 2/2014 | Yoon et al. |
| 8,730,727 | B2 | 5/2014 | Yoe et al. |

(Continued)

*Primary Examiner* — Ismail Muse
(74) *Attorney, Agent, or Firm* — Harness, Dickey & Pierce, P.L.C.

(57) ABSTRACT

A semiconductor device includes a substrate, gate electrodes and interlayer insulating layers alternately stacked on the substrate, channel regions penetrating through the gate electrodes and the interlayer insulating layers, a conductive layer penetrating through the gate electrodes and the interlayer insulating layers, an insulating layer covering an upper surface of the conductive layer, a contact plug penetrating through the insulating layer and connected to the conductive layer, and an air gap formed in the conductive layer. The conductive layer is connected to the substrate and extends between two groups of the channel regions. The air gap is defined by the contact plug, insulating layer and an inner sidewall of the conductive layer.

19 Claims, 27 Drawing Sheets

(56) References Cited

U.S. PATENT DOCUMENTS

| | | | | |
|---|---|---|---|---|
| 8,766,446 B2* | 7/2014 | Kuge | ............... | H01L 27/1157 |
| | | | | 257/306 |
| 8,803,222 B2* | 8/2014 | Lee | ............... | H01L 27/11556 |
| | | | | 257/324 |
| 9,449,982 B2* | 9/2016 | Lu | ............... | H01L 27/1157 |
| 9,460,931 B2* | 10/2016 | Pachamuthu | ..... | H01L 21/28282 |
| 2007/0158732 A1 | 7/2007 | Kim | | |
| 2010/0186668 A1* | 7/2010 | Quick | ............... | C23C 16/409 |
| | | | | 118/715 |
| 2011/0233648 A1* | 9/2011 | Seol | ............... | H01L 21/32137 |
| | | | | 257/324 |
| 2012/0068242 A1* | 3/2012 | Shin | ............... | H01L 27/11578 |
| | | | | 257/315 |
| 2013/0009235 A1 | 1/2013 | Yoo | | |
| 2013/0083599 A1* | 4/2013 | Nam | ............... | G11C 16/14 |
| | | | | 365/185.11 |
| 2013/0264631 A1 | 10/2013 | Alsmeier et al. | | |
| 2013/0330926 A1 | 12/2013 | Chandrashekar et al. | | |
| 2014/0284697 A1* | 9/2014 | Wang | ............... | H01L 27/115 |
| | | | | 257/324 |
| 2015/0243675 A1* | 8/2015 | Lim | ............... | H01L 27/11556 |
| | | | | 257/324 |
| 2015/0333011 A1* | 11/2015 | Ting | ............... | H01L 21/7685 |
| | | | | 257/751 |
| 2016/0071868 A1* | 3/2016 | Arai | ............... | H01L 23/528 |
| | | | | 257/325 |
| 2017/0200735 A1* | 7/2017 | Konagai | ............... | H01L 27/11582 |

\* cited by examiner

SEMICONDUCTOR DEVICE COMPRISING A CONDUCTIVE LAYER HAVING AN AIR GAP

CROSS-REFERENCE TO RELATED APPLICATION

This application claims priority under 35 U.S.C. § 119 to Korean Patent Application No. 10-2015-0066325, filed on May 12, 2015 in the Korean Intellectual Property Office, the entire disclosure of which is incorporated herein by reference.

BACKGROUND

The present disclosure relates to a semiconductor device.

While sizes of semiconductor devices have been reduced, semiconductor devices have been used to process massive data. Thus, the degree of integration of such semiconductor devices has been increased. Accordingly, a semiconductor device having a vertical transistor structure rather than a planar transistor structure has been suggested in order to increase the degree of integration of semiconductor devices.

SUMMARY

Example embodiments of inventive concepts relate to a semiconductor device having improved reliability, as defects thereof may be limited (and/or prevented).

According to example embodiments of inventive concepts, a semiconductor device may include a substrate, gate electrodes and interlayer insulating layers alternately stacked on the substrate, channel regions penetrating through the gate electrodes and the interlayer insulating layers, a conductive layer penetrating through the gate electrodes and the interlayer insulating layers, an insulating layer covering an upper surface of the conductive layer, and a contact plug penetrating through the insulating layer and connected to the conductive layer. The conductive layer is connected to the substrate and extends between two groups of the channel regions. The contact plug, the insulating layer and an inner sidewall of the conductive layer define an air gap in the conductive layer.

In example embodiments, the air gap may be open to the upper surface of the conductive layer.

In example embodiments, the air gap may extend toward the substrate along the conductive layer from an upper portion of the conductive layer.

In example embodiments, the contact plug may contact the conductive layer on both sides of the air gap.

In example embodiments, the gate electrodes and the interlayer insulating layer may define an open portion that exposes the substrate. The conductive layer may extend into the open portion. The air gap may be formed in the conductive layer in the open portion.

In example embodiments, the semiconductor device may include a plurality of contact plugs. The conductive layer may extend linearly in one direction. The plurality of contact plugs may include the contact plug. The plurality of the contact plugs may be spaced apart from each other on the conductive layer.

In example embodiments, a width of the contact plug may be narrower than an overall width of the conductive layer on the upper surface thereof.

In example embodiments, the contact plug may be in a recessed portion of the conductive layer.

In example embodiments, the contact plug may extend to an inside of the air gap, such that a lower surface of the contact plug may be positioned at a height lower than that of the upper surface of the conductive layer.

In example embodiments, a lower end of the air gap may be spaced apart from an upper surface of the substrate by a predetermined (and/or alternatively desired) distance.

In example embodiments, the height from the upper surface of the substrate to the lower end of the air gap may be equal to 15% or more of a height of the conductive layer.

In example embodiments, the semiconductor device may further include a dielectric layer on the upper surface of the conductive layer and the dielectric layer may be exposed through the air gap.

In example embodiments, the conductive layer may have a shape in which a width thereof decreases in proximity to the substrate.

In example embodiments, the width of the conductive layer may increase from the upper surface thereof to a point at an intermediate depth, and decrease from the point at the intermediate depth to the substrate.

According to example embodiments of inventive concepts, a semiconductor device may include a substrate having a conductive region, an insulating layer on the substrate, a conductive layer penetrating through the insulating layer, and a contact plug electrically connected to the conductive layer. The conductive layer may be connected to the substrate. The contact plug may be electrically connected to the conductive layer. The contact plug and the conductive layer may define an air gap open to an upper surface of conductive layer and surrounded by the conductive layer. The air gap may be covered by the contact plug such that the contact plug is on the upper surface of the conductive layer.

According to example embodiments of inventive concepts, a semiconductor device includes a substrate, a plurality of memory strings spaced apart from each other on the substrate, a conductive layer between the two groups of memory strings, and a contact plug on the conductive layer. The two groups of memory strings are spaced apart from each other. Each of the memory strings includes a string selection transistor on a ground selection transistor, and a plurality of memory cells stacked on top of each of each other between the ground selection transistor and the string selection transistor. The conductive layer includes a trench formed in the conductive layer that opens to a top of the conductive layer and has a depth less than a total height of the conductive layer. The contact plug covers the trench and is spaced apart from a bottom of the trench to define an air gap surrounded by the conductive layer.

In example embodiments, the semiconductor device may further include an insulating layer between the two groups of memory strings. The insulating layer may define an open portion that exposes the substrate. The conductive layer and the air gap may be positioned in the open portion.

In example embodiments, a bottom of the contact plug may extend partially into the trench such that the bottom of the contact plug may be below an upper surface of conductive layer.

In example embodiments, the semiconductor device may further include a dielectric layer covering inner sidewalls of the conductive layer in the trench. The dielectric layer may be between the contact plug and the bottom of the trench.

In example embodiments, a width of the air gap may be greater at an intermediate portion of the air gap than the width of the air gap at a top portion of the air gap. The width of the air gap may be greater at the intermediate portion than the width of the air gap at a bottom of the air gap.

BRIEF DESCRIPTION OF DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
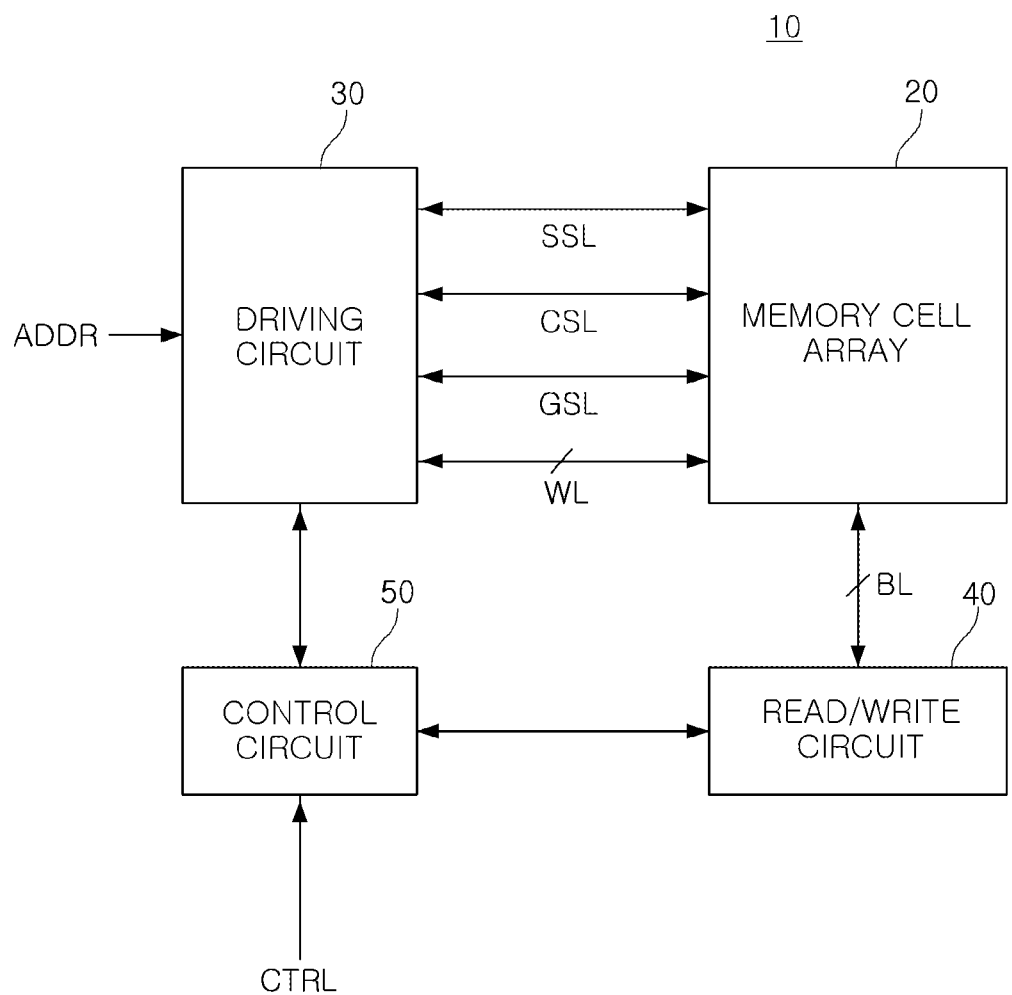
FIG. 1 is a block diagram schematically illustrating a semiconductor device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element (s) or feature (s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram schematically illustrating a semiconductor device according to example embodiments.

Referring to FIG. 1, a semiconductor device 10, according to example embodiments, may include a memory cell array 20, a driving circuit 30, a read/write circuit 40, and a control circuit 50.

The memory cell array 20 may include a plurality of memory cells, wherein the plurality of memory cells may be arrayed in a plurality of rows and columns. The plurality of memory cells included in the memory cell array 20 may be connected to the driving circuit 30 through a word line WL, a common source line CSL, a string select line SSL, a ground select line GSL, and the like, and may be connected to the read/write circuit 40 through a bit line BL. According to example embodiments, a plurality of memory cells linearly arrayed in the same row may be connected to the same word line WL, and a plurality of memory cells linearly arrayed in the same column may be connected to the same bit line BL.

The plurality of memory cells included in the memory cell array 20 may be divided into a plurality of memory blocks. Each of the plurality of memory blocks may include a plurality of word lines WL, a plurality of string select lines SSL, a plurality of ground select lines GSL, a plurality of bit lines BL, and at least one common source line CSL.

The driving circuit 30 and the read/write circuit 40 may be operated by the control circuit 50. According to example embodiments, the driving circuit 30 may receive externally provided address information ADDR and decode the address information ADDR to select at least a portion of the word line WL, the common source line CSL, the string select line SSL, and the ground select line SSL connected to the memory cell array 20. The driving circuit 30 may include driving circuits for the word line WL, the string select line SSL, and the common source line CSL.

The read/write circuit 40 may select at least a portion of the bit line BL connected to the memory cell array 20 in response to a command transmitted by the control circuit 50. The read/write circuit 40 may read data written to a memory cell connected to the selected at least a portion of the bit line BL, or may write data to the memory cell connected to the selected at least a portion of the bit line BL. In order to conduct such operations, the read/write circuit 40 may include a circuit such as a page buffer, an input/output buffer, a data latch, and the like.

The control circuit 50 may respond to a control signal CTRL transferred externally to control operations of the driving circuit 30 and the read/write circuit 40. In the case of reading data written to the memory cell array 20, the control circuit 50 may control the operation of the driving circuit 30 to supply voltage required for a reading operation to a word line WL storing the data to be read. When the voltage for the reading operation is supplied to a specific word line WL, the control circuit 50 may control the read/write circuit 40 to read the data written to the memory cell connected to the word line WL supplied with the voltage for the reading operation.

When data is written to the memory cell array 20, the control circuit 50 may control the operation of the driving circuit 30 to supply voltage required for a writing operation to the word line WL to which the data will be written. When the voltage required for the writing operation is supplied to a specific word line WL, the control circuit 50 may control the read/write circuit 40 to write the data to the memory cell connected to the word line WL supplied with the voltage required for the writing operation.

Figure 2:
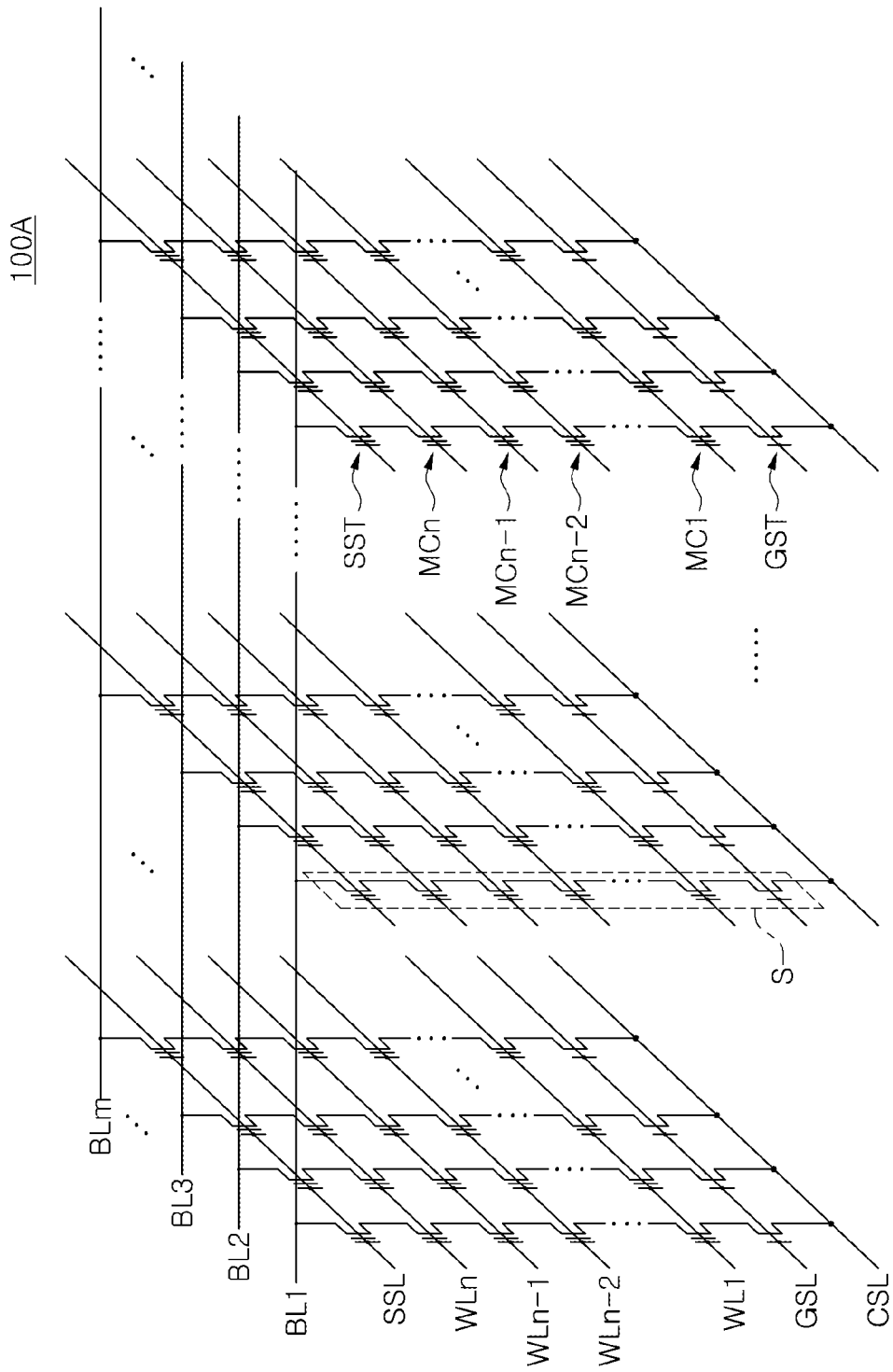
FIG. 2 is an equivalent circuit diagram illustrating a memory cell array of a semiconductor device according to example embodiments of inventive concepts.

FIG. 2 is an equivalent circuit diagram illustrating a memory cell array of a semiconductor device according to example embodiments.

FIG. 2 is an equivalent circuit diagram illustrating a three-dimensional structure of a memory cell array included in the semiconductor device 100A having a vertical structure. Referring to FIG. 2, the memory cell array may include a plurality of memory cell strings including memory cell elements MC1 to MCn connected in series, and a ground select transistor GST and a string select transistor SST respectively connected to both ends of the memory cell elements MC1 to MCn in series.

The memory cell elements MC1 to MCn connected in series may respectively be connected to word lines WL1 to WLn to select at least a portion of the memory cell elements MC1 to MCn.

A gate terminal of the ground select transistor GST may be connected to a ground select line GSL, and a source terminal of the ground select transistors GST may be connected to a common source line CSL. Meanwhile, a gate terminal of the string select transistor SST may be connected to a string select line SSL, and a source terminal of the string select transistor SST may be connected to a drain terminal of a memory cell element MCn. FIG. 2 illustrates a structure in which one ground select transistor GST and one string select transistor SST are connected to the memory cell elements MC1 to MCn connected in series, but a plurality of ground select transistors GST or a plurality of string select transistors SST may be connected to the memory cell elements MC1 to MCn.

A drain terminal of the string select transistor SST may be connected to bit lines BL1 to BLm. When a signal is applied to the gate terminal of the string select transistor SST through the string select line SSL, a signal applied through the bit lines BL1 to BLm may be transferred to the memory cell elements MC1 to MCn connected in series, so that a data-writing operation may be performed. Also, a data-reading operation may be performed by reading data from the memory cell elements MC1 to MCn using the bit lines BL1 to BLm.

Figure 3:
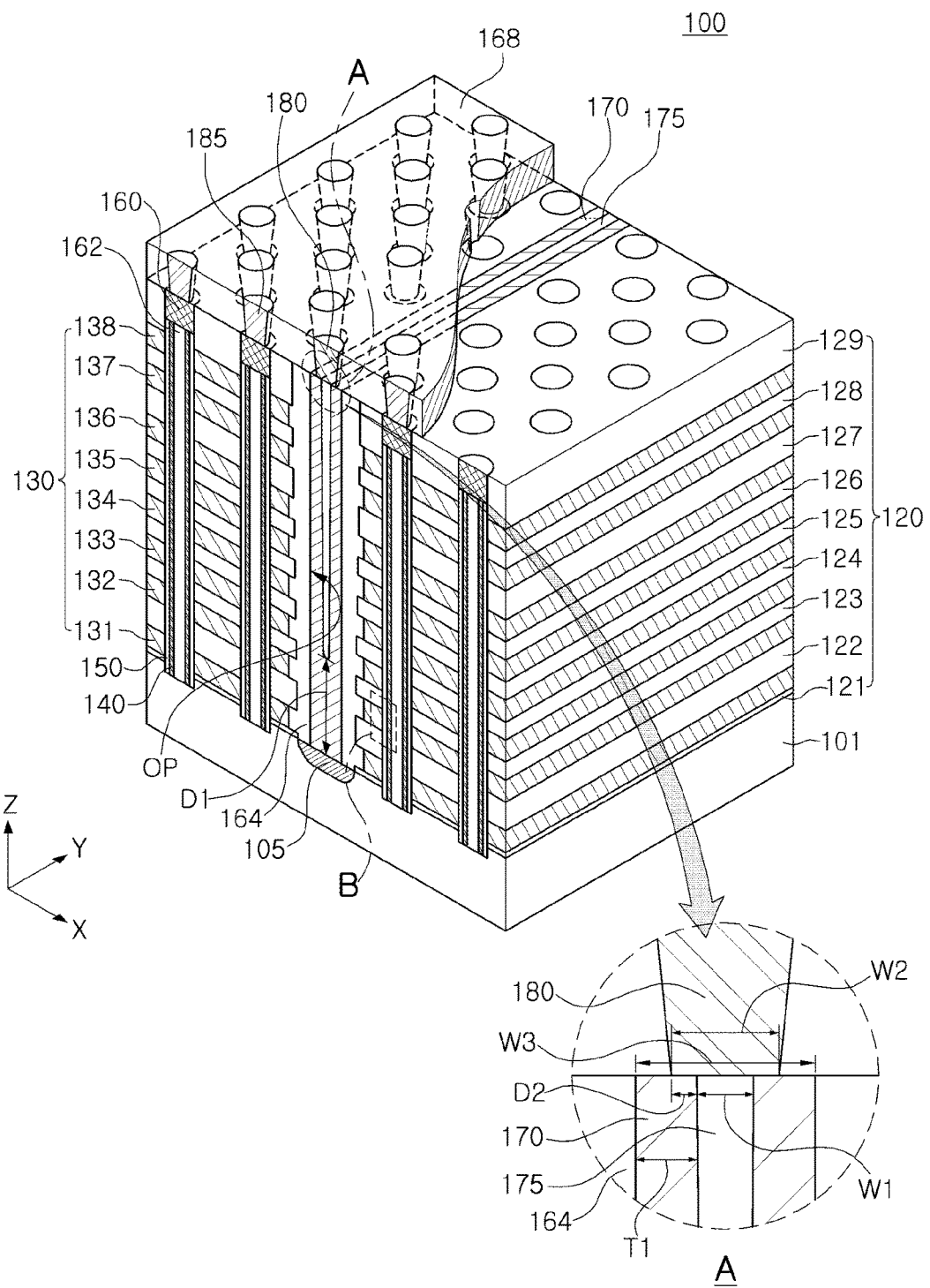
FIG. 3 is a perspective view schematically illustrating a structure of memory cell strings of a semiconductor device according to example embodiments of inventive concepts.

FIG. 3 is a perspective view schematically illustrating a structure of memory cell strings of a semiconductor device according to example embodiments.

Referring to FIG. 3, a semiconductor device 100 may include a substrate 101, a plurality of channel regions 140 disposed to be perpendicular to an upper surface of the substrate 101, and a plurality of interlayer insulating layers 120 and a plurality of gate electrodes 130 stacked along outer sidewalls of the channel regions 140. The semiconductor device 100 may further include a gate dielectric layer 150 disposed between the channel regions 140 and the gate electrodes 130, a channel pad 160 on the channel regions 140, an impurity region 105, a conductive layer 170 on the impurity region 105, an air gap 175 in the conductive layer 170, and first and second contact plugs 180 and 185 disposed on the conductive layer 170 and the channel pad 160. In FIG. 3, part of an upper wiring structure is not illustrated. For example, some components such as bit lines BL1 to BLm (see FIG. 2) are not illustrated in FIG. 3.

In the semiconductor device 100, one memory cell string may be configured with each of the channel regions 140 as a center, and a plurality of memory cell strings may be arrayed in rows and columns in an x-direction and a y-direction.

The substrate 101 may have the upper surface extending to the x-direction and the y-direction. The substrate 101 may include a semiconductor material such as that of a group IV semiconductor, a group III-V compound semiconductor, or a group II-VI oxide semiconductor. For example, the IV semiconductor may include silicon, germanium, or silicon-germanium. The substrate 101 may be provided as a bulk wafer or an epitaxial layer.

The channel regions 140 having a pillar shape may be disposed on the upper surface of the substrate 101 to extend in a direction perpendicular to the substrate 101 (a z-direction). The channel regions 140 may be formed in an annular shape surrounding a first insulating layer 162 inside the channel regions 140, but are not limited thereto. For example, the channel regions 140 may have a pillar shape such as a cylinder or a prism without the first insulating layer 162 therein. The channel regions 140 may have an inclined side surface in which a width thereof narrows as a distance thereof from the substrate 101 decreases according to an aspect ratio thereof.

The channel regions 140 may be disposed to be spaced apart from each other in the x-direction and the y-direction, and to be shifted from each other in one direction. In detail, the channel regions 140 may be disposed to form a grid, or in a zigzag line from one direction. However, a disposition of the channel regions 140 is not limited thereto, and may be various according to example embodiments. A portion of the channel regions 140 may be provided as a dummy channel. In this specification, the term "dummy" refers to a component that is the same as or similar to another component in terms of structure and shape but is provided only as a pattern not performing a practical function in the semiconductor device 100. Thus, an electrical signal may not applied to the dummy component, and even when an electrical signal is applied thereto, the dummy component does not perform the same function as a function performed by other components.

A lower surface of the channel regions 140 may be connected to the substrate 101. The channel regions 140 may include a semiconductor material such as polycrystalline silicon and single crystal silicon, wherein the semiconductor material may be an undoped material or a material including a P-type or N-type impurity.

The plurality of gate electrodes 131 to 138 collectively represented by 130 may be disposed to be spaced apart from the substrate 101 in the z-direction along a side surface of each of the channel regions 140. Referring to FIGS. 2 and 3, the gate electrodes 130 may form gates of a ground select transistor GST, a plurality of memory cell elements MC1 to MCn, and string select transistors SST. The gate electrodes 130 may extend to form word lines WL1 to WLn, and may be commonly connected to a unit of memory cell strings arranged in the x-direction and the y-direction to be adjacent to each other. In example embodiments, five gate electrodes 132 to 136 of the memory cells MC1 to MCn may be arrayed, but the number of the gate electrodes is not limited thereto. The number of the gate electrodes 130 configuring the memory cells MC1 to MCn may be determined depending on a capacity of the semiconductor device 100. For example, the number of the gate electrodes 130 comprising the memory cell elements MC1 to MCn may be $2^n$ (n is a natural number).

The gate electrode 131 of the ground select transistor GST may extend in the y-direction to form a ground select line GSL. A portion of the substrate 101 below the gate electrode 131 may also be doped with an impurity for the functioning of the ground select transistor GST.

The gate electrodes 137 and 138 of the string select transistors SST may extend in the y-direction to form string select lines SSL. Since the gate electrodes 137 and 138 of the string select transistors SST linearly disposed in the x-direction have separate wiring structures, the memory cell strings adjacent to each other may respectively be connected to different bit lines BL1 to BLm (see FIG. 2). In example embodiments, the gate electrodes 137 and 138 of the string select transistors SST may be separated from each other between the memory cell strings adjacent to each other in the x-direction to form different string select lines SSL. According to example embodiments, the number of the gate electrodes 137 and 138 of the string select transistors SST and the gate electrode 131 of the ground select transistor GST may be respectively one or more, and the gate electrodes 137 and 138 of the string select transistors SST and the gate electrode 131 of the ground select transistor GST may have the same or a different structure from a structure of the gate electrodes 132 to 136 of the memory cell elements MC1 to MCn.

Some gate electrodes 130, such as gate electrodes disposed adjacently to the gate electrode 131 of the ground select transistor GST and/or the gate electrodes 137 and 138 of the string select transistors SST, may be dummy gate electrodes. For example, the gate electrode 132 disposed adjacently to the gate electrode 131 of the ground select transistor GST may be a dummy gate electrode.

The gate electrodes 130 may include polycrystalline silicon, metal material, or metal silicide material. The metal silicide material may be, for example, a silicide material formed of metal selected from cobalt (Co), nickel (Ni), hafnium (Hf), platinum (Pt), tungsten (W), and titanium (Ti), or combinations thereof. In example embodiments, the gate electrodes 130 may include metal material such as tungsten (W). The gate electrodes 130 may further include a diffusion barrier layer. For example, the diffusion barrier layer may include, for example, tungsten nitride (WN), tantalum nitride (TaN), titanium nitride (TiN), or combinations thereof.

A plurality of interlayer insulating layers 121 to 129 (collectively represented by 120) may be arrayed between the gate electrodes 130. The interlayer insulating layers 120, like the gate electrodes 130, may be spaced apart from each other in the z-direction and extend in the y-direction. The interlayer insulating layers 120 may include an insulating material such as a silicon oxide or a silicon nitride, but example embodiments are not limited thereto and other insulating materials may be used.

The gate dielectric layer 150 may be disposed between the gate electrodes 130 and the channel regions 140. The gate dielectric layer 150 may extend perpendicular to the substrate 101 along the channel regions 140. The gate dielectric layer 150 may include a tunneling layer, an electric charge storage layer, and a blocking layer, sequentially surrounding the channel regions 140. Descriptions of the tunneling layer, the electric charge storage layer, and the blocking layer will be provided below with reference to FIGS. 4A through 4C.

The channel pad 160 may be disposed in an upper end of the memory cell strings to cover an upper surface of the first insulating layer 162 and be electrically connected to the channel regions 140. The channel pad 160 may include, for example, doped polycrystalline silicon. The channel pad 160 may serve as a drain region of the string select transistor SST (see FIG. 2). The channel pad 160 may be electrically connected to the bit lines BL1 to BLm (see FIG. 2) by the second contact plug 185. The second contact plug 185 may include a conductive material, for example, metal material such as tungsten (W).

The conductive layer 170 may penetrate through the gate electrodes 130 and the interlayer insulating layers 120 to be connected to the substrate 101, between the channel regions 140. The conductive layer 170 may be electrically insulated from the gate electrodes 130 by a second insulating layer 164. The conductive layer 170 may be linearly disposed to extend in the y-direction. The conductive layer 170 may be provided in plural to be spaced apart from each other by a predetermined and/or desired distance in the x-direction. For example, the conductive layer 170 may be disposed between every two to four columns of channel regions 140, but is not limited thereto. A width of the conductive layer 170 may become narrower as a distance thereof from the substrate 101 decreases, due to a relatively high aspect ratio thereof, but is not limited thereto.

The conductive layer 170 may be disposed in an open portion OP having a trench shape penetrating through the gate electrodes 130 and the interlayer insulating layers 120 to be connected to the substrate 101 while covering a sidewall of the open portion OP. However, the conductive layer 170 may not fill the entire open portion OP, but may fill a lower portion of the open portion OP. The open portion OP not filled with the conductive layer 170 may be an air gap 175.

The conductive layer 170 may form the common source line CSL of FIG. 2 and include metal such as tungsten (W), aluminum (Al), copper (Cu), and the like.

The air gap 175 may be defined by the conductive layer 170, the first contact plug 180, and an upper insulating layer 168. The air gap 175 may be positioned in the conductive layer 170 within the open portion OP while being open to an upper surface of the conductive layer 170. In detail, the air gap 175 may be open to an entire upper surface of the conductive layer 170 defined by an outline of the conductive layer 170. An upper end of the air gap 175 not surrounded by the conductive layer 170 may be defined by the first contact plug 180 or the upper insulating layer 168. The air gap 175 may extend toward the substrate 101 along the conductive layer 170 from an upper portion of the open portion OP, but may also extend to a height D1 above the upper surface of the substrate 101. The height D1 may be equal to 15% or more of a height of the conductive layer 170. Accordingly, the open portion OP below the air gap 175 may be filled with the conductive layer 170. The air gap 175 may extend in the y-direction along the conductive layer 170.

In the semiconductor device 100, according to example embodiments, since the air gap 175 having an open upper portion may be disposed in the conductive layer 170, a defect occurring due to outgassing which may occur in a case in which a seam appears inside may be limited (and/or prevented). In detail, since a gas material and the like may escape through the air gap 175 having the open upper portion in a process in which the semiconductor device 100 is manufactured, a phenomenon in which a gas material in the seam is outgassed to damage the surrounding second insulating layer 164 and the like may be limited (and/or prevented).

The upper insulating layer 168 may be disposed on the interlayer insulating layer 129 and the conductive layer 170. The first contact plug 180 may penetrate through the upper insulating layer 168 to be connected to the conductive layer 170. The first contact plug 180 may be disposed on an upper end of the air gap 175 and contact the conductive layer 170 to be connected thereto on both sides of the air gap 175.

Referring to an enlarged view illustrating 'A' region of FIG. 3, the upper end of the air gap 175 may have a first width W1, and a lower surface of the first contact plug 180 coming in contact with the air gap 175 may have a second width W2 greater than that of the first width W1. The second width W2 may be narrower than an overall width W3 of the conductive layer 170. Accordingly, the first contact plug 180, in example embodiments, may be connected to the conductive layer 170 on the both sides of the air gap 175, while being disposed on the upper end of the air gap 175. An x-direction length D2 of a contact surface between the first contact plug 180 and the conductive layer 170 may be less than a thickness T1 of the conductive layer 170 in a sidewall of the open portion OP, but is not limited thereto, and may be various according to example embodiments. For example, in example embodiments, the first contact plug 180 may contact the conductive layer 170 only at one side of the conductive layer 170.

The impurity region 105 may be disposed inside the substrate 101 below the conductive layer 170. The impurity region 105 may extend in the y-direction while being adjacent to the upper surface of the substrate 101. The impurity region 105 may include an impurity having the same or different conductivity from the substrate 101. When the impurity region 105 includes an impurity having the same conductivity as the substrate 101, higher concentration of an impurity than the substrate 101 may be included. The conductive layer 170 may apply voltage to the substrate 101 through the impurity region 105.

The second contact plugs 185 may be disposed on the channel pad 160. The second contact plugs 185 may be provided as a portion of a wiring structure connecting the channel regions 140 to the bit lines BL1 to BLm (see FIG. 2). In example embodiments, heights of the second contact plugs 185 are illustrated to be the same as the height of the first contact plugs 180, but are not limited thereto.

Figure 4A:
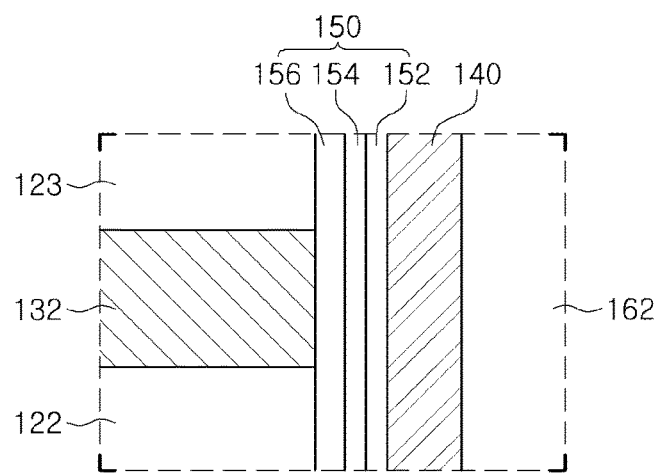
FIGS. 4A through 4C are cross-sectional views provided to illustrate a gate dielectric layer according to example embodiments of inventive concepts, in which region B of FIG. 3 is illustrated.
Figure 4B:
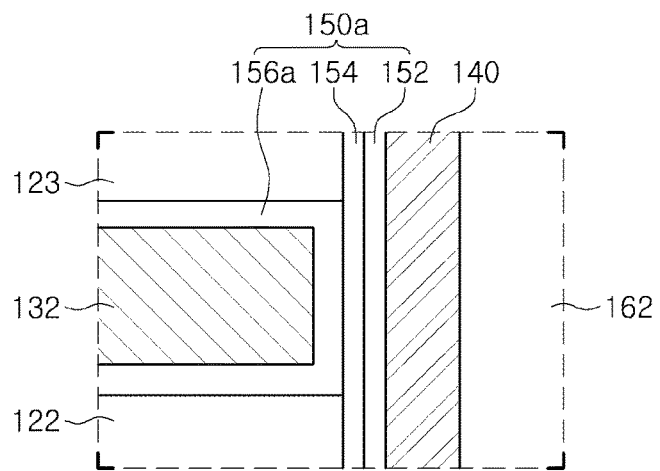
Figure 4C:
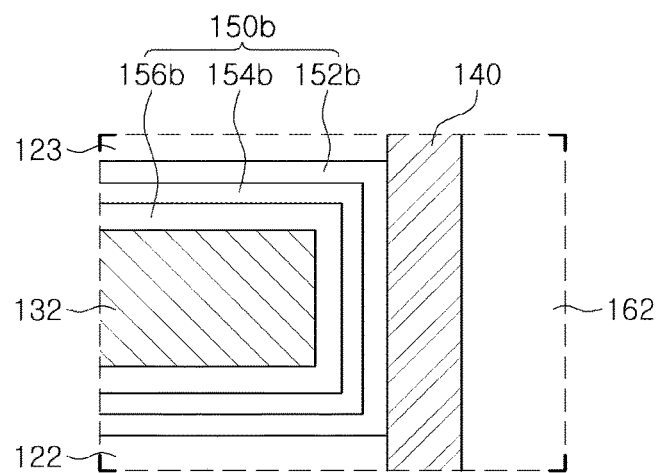

FIGS. 4A through 4C are cross-sectional views provided to illustrate a gate dielectric layer according to example embodiments. A region corresponding to region B of FIG. 3 is illustrated.

Referring to FIG. 4A, a gate electrode 132, a gate dielectric layer 150, and a channel region 140 of memory cell strings are illustrated. The gate dielectric layer 150 may include a tunneling layer 152, a charge storage layer 154, and a blocking layer 156, sequentially stacked to surround the channel region 140.

The tunneling layer 152 may allow for a tunneling of a charge to the charge storage layer 154 through an F-N tunneling mechanism. For example, the tunneling layer 152 may include a silicon dioxide ($SiO_2$), a silicon nitride ($Si_3N_4$), a silicon oxynitride (SiON), or combinations thereof.

The charge storage layer 154 may be provided as a charge trap layer or a floating gate conductive layer. For example, the charge storage layer may include a dielectric material, a quantum dot, or a nanocrystal. Here, the quantum dot or the nanocrystal may be formed of an electric conductor such as metal or semiconductor nanoparticles. According to example embodiments, when the charge storage layer 154 is provided as the charge trap layer, the charge storage layer 154 may include a silicon nitride.

The blocking layer 156 may include a silicon dioxide ($SiO_2$), a silicon nitride ($Si_3N_4$), a silicon oxynitride (SiON), a high-k dielectric material, or combinations thereof. The high-k material may be any one of an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$).

In FIG. 4B, a gate electrode 132, a gate dielectric layer 150a, and a channel region 140 of memory cell strings are illustrated. The gate dielectric layer 150a may have a structure in which a tunneling layer 152, a charge storage layer 154, and a blocking layer 156a are sequentially stacked from the channel region 140. Relative thicknesses of the tunneling layer 152, the charge storage layer 154, and the blocking layer 156a included in the gate dielectric layer 150a may not be limited to thicknesses illustrated in FIG. 4B, and may be variously changed.

In particular, unlike in FIG. 4A, the blocking layer 156a of the gate dielectric layer 150a may be disposed to surround the gate electrode 132, while the tunneling layer 152 and the charge storage layer 154 of the gate dielectric layer 150a are disposed to extend vertically along the channel region 140.

In FIG. 4C, a gate electrode 132, a gate dielectric layer 150b, and a channel region 140 of memory cell strings are illustrated. The gate dielectric layer 150b may have a structure in which a tunneling layer 152b, a charge storage layer 154b, and a blocking layer 156b are sequentially stacked from the channel region 140.

In particular, unlike in FIGS. 4A and 4B, all of the tunneling layer 152b, the charge storage layer 154b, and the blocking layer 156b included in the gate dielectric layer 150b are disposed to surround the gate electrode 132. In example embodiments, a portion of the blocking layer 156b may be disposed to extend vertically along the channel region 140 while a portion of the blocking layer 156b may be disposed to surround the gate electrode 132.

Although not illustrated, one of ordinary skill in the art would appreciate the gate dielectric layer 150b in FIG. 4C could be modified so the tunneling layer 152b has the same structure as the tunneling layer 152 in FIG. 4B.

FIGS. 5 through 9 are cross-sectional views schematically illustrating semiconductor devices according to example embodiments.

Figure 5:
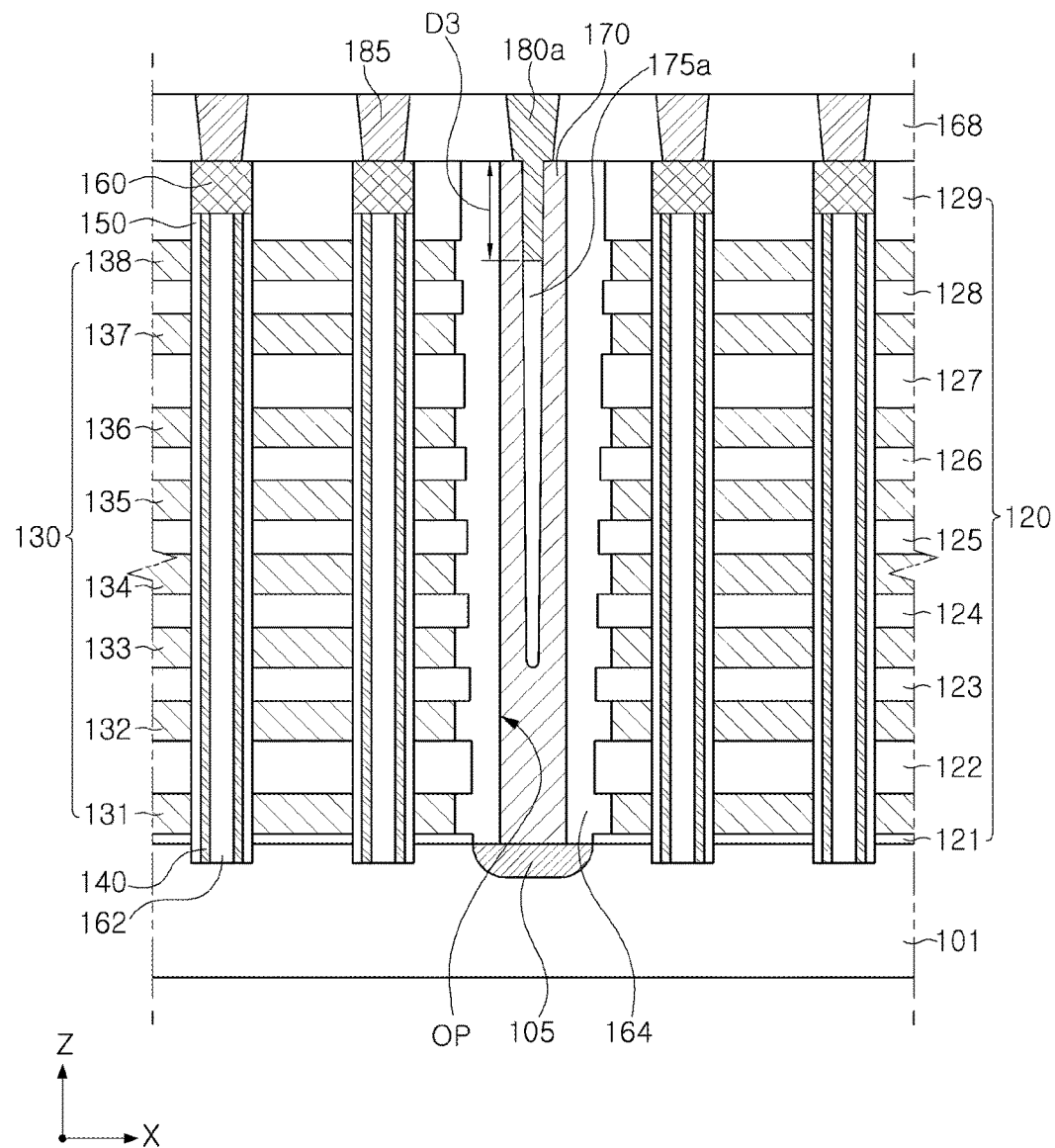
FIGS. 5 through 9 are cross-sectional views schematically illustrating a semiconductor device according to example embodiments of inventive concepts.

Referring to FIG. 5, in example embodiments, a semiconductor device 100a may include a substrate 101, a plurality of channel regions 140, a plurality of interlayer insulating layers 120, a plurality of gate electrodes 130, a gate dielectric layer 150, a channel pad 160, an impurity region 105, a conductive layer 170, an air gap 175a in the conductive layer 170, and first and second contact plugs 180a and 185.

In particular, the first contact plug 180a may have a lower surface positioned at a height lower than that of an upper surface of the conductive layer 170 by a distance D3. Accordingly, the first contact plug 180a may contact the conductive layer 170 within an open portion OP, and the distance D3 by which the first contact plug 180a extends to an inside of the open portion OP may be variously changed. The first contact plug 180a may have a step on the upper surface of the conductive layer 170.

Such a structure may be formed as a material forming the first contact plug 180a flows into the air gap 175a in a process in which the first contact plug 180a is formed. Accordingly, the air gap 175a may be formed by the conductive layer 170, the first contact plug 180a, and an upper insulating layer 168. In a region in which the first contact plug 180a is not disposed, an upper end of the air gap 175a may be positioned at the same height as the height of the upper surface of the conductive layer 170.

Figure 6:
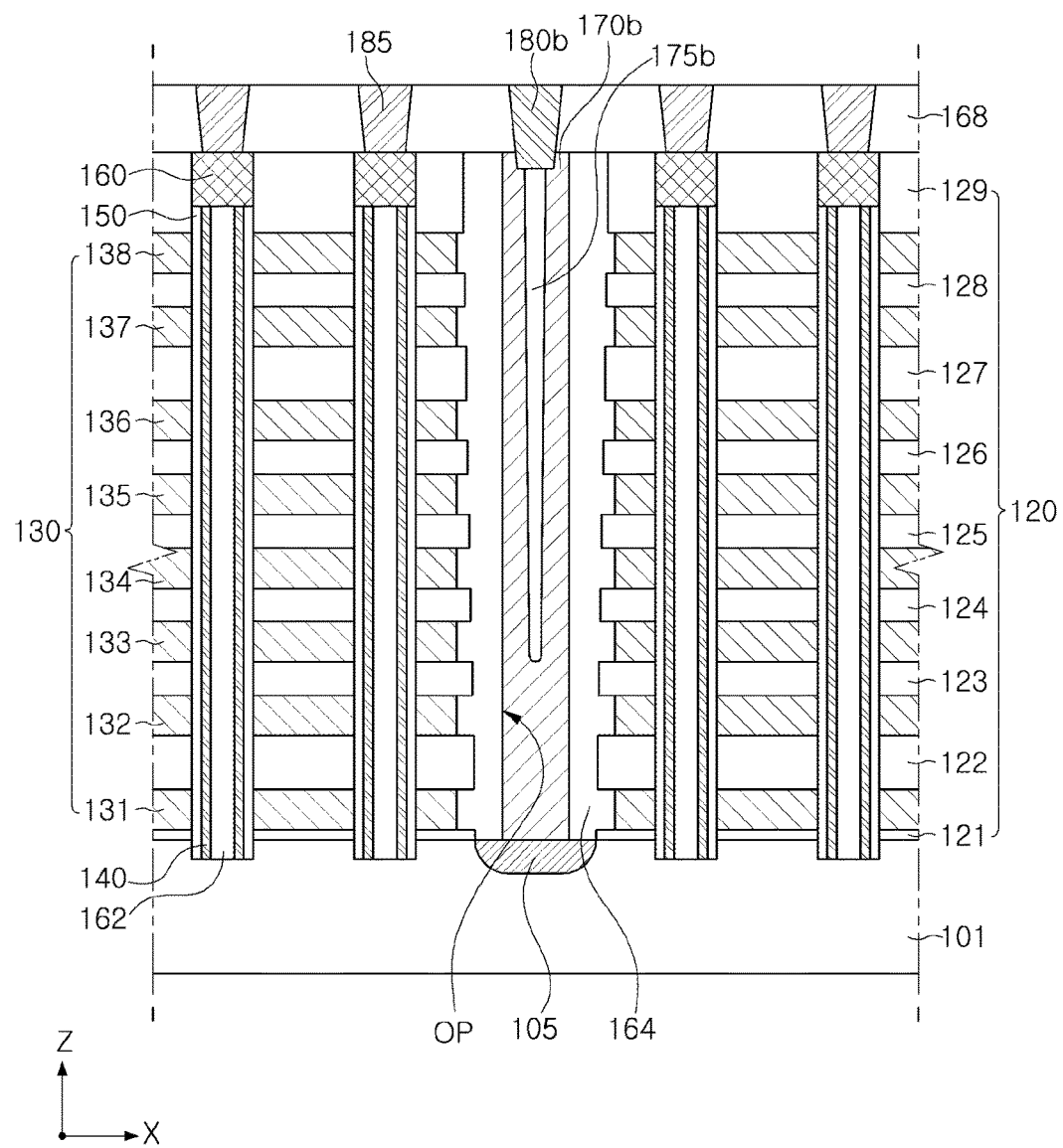

Referring to FIG. 6, a semiconductor device 100b may include a substrate 101, a plurality of channel regions 140, a plurality of interlayer insulating layers 120, a plurality of gate electrodes 130, a gate dielectric layer 150, a channel pad 160, an impurity region 105, a conductive layer 170b, an air gap 175b in the conductive layer 170b, and first and second contact plugs 180b and 185.

In particular, the first contact plug 180b may recess the conductive layer 170b by a predetermined and/or desired depth from an upper surface of the conductive layer 170b and be disposed in the recessed portion of the conductive layer 170b. Accordingly, a lower surface of the first contact plug 180b may be positioned at a height lower than that of the upper surface of the conductive layer 170b. The depth by which the conductive layer 170b is recessed may be variously changed in example embodiments.

Figure 7:
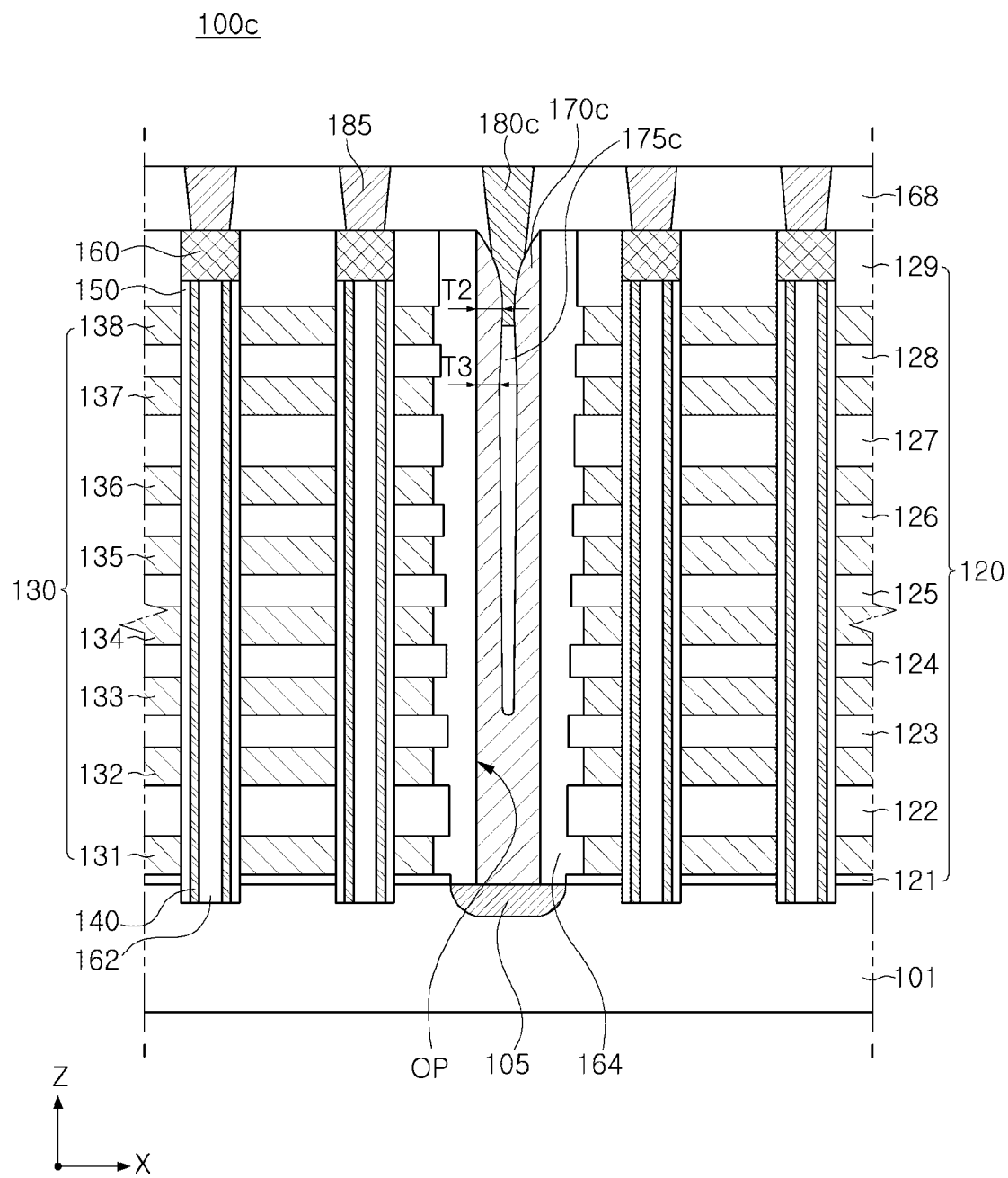

Referring to FIG. 7, the semiconductor device 100c may include a substrate 101, a plurality of channel regions 140, a plurality of insulating layer 120, a plurality of gate electrodes 130, a gate dielectric layer 150, a channel pad 160, an impurity region 105, a conductive layer 170c, an air gap 175c in the conductive layer 170c, and first and second contact plugs 180c and 185.

In particular, the conductive layer 170c, according to example embodiments, may have a non-uniform thickness. In detail, the conductive layer 170c may have a second thickness T2 in an upper portion thereof and have a third thickness T3 less than the second thickness T2 in a lower portion thereof. In example embodiments, the conductive layer 170c may have relatively the greatest thickness on the upper surface thereof. Such a structure may be formed during a process in which the conductive layer 170c is formed when a deposition material is transferred, and may be applied to other semiconductor devices according to example embodiments.

The first contact plug 180c may extend to an inside of an open portion OP and contact the conductive layer 170c within the open portion OP. However, unlike in FIG. 5, the first contact plug 180c may extend to the inside of the open portion OP without having a step on the upper surface of the conductive layer 170c.

Figure 8:
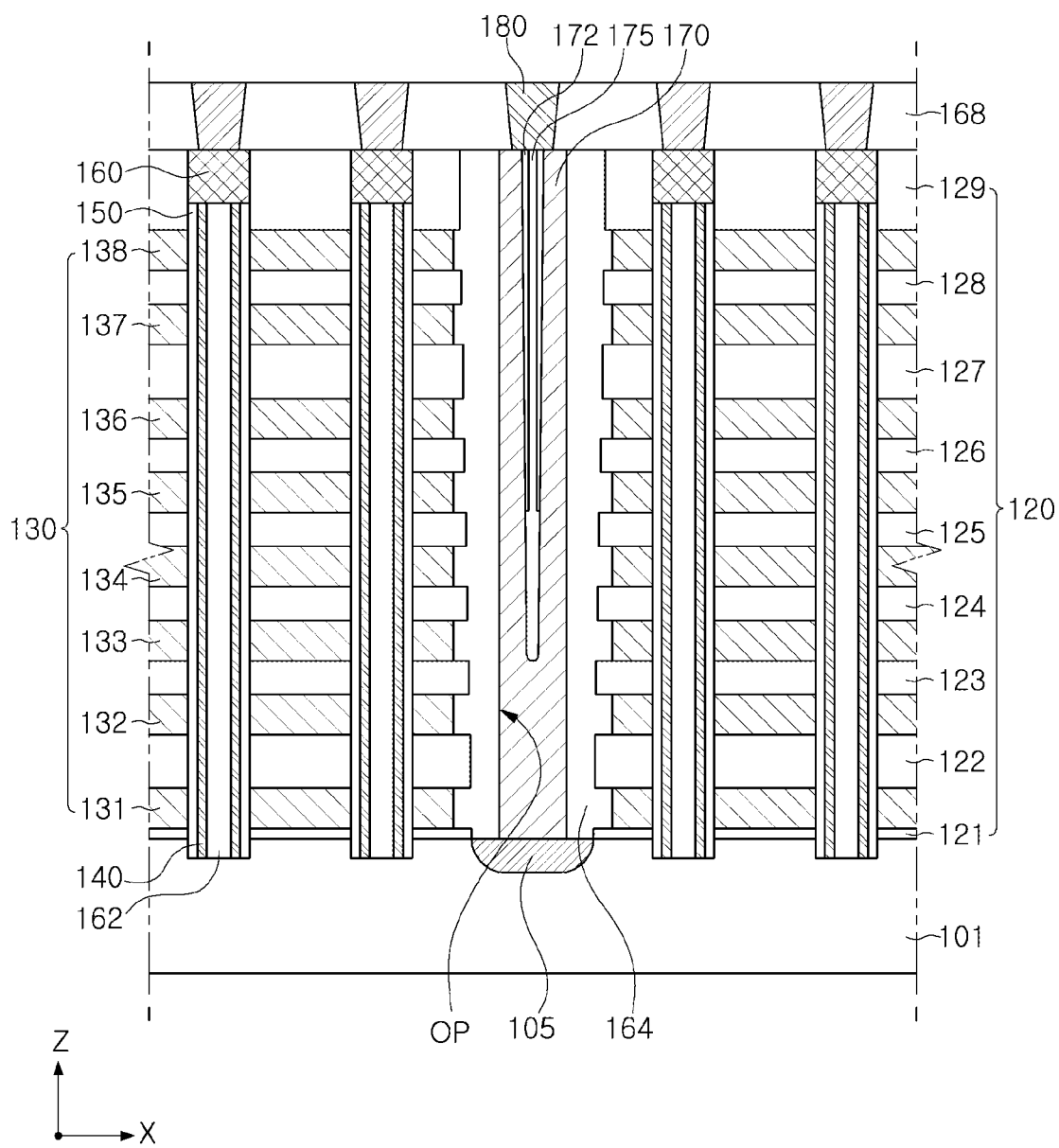

Referring to FIG. 8, a semiconductor device 100d may include a substrate 101, a plurality of channel regions 140, a plurality of interlayer insulating layers 120, a plurality of gate electrodes 130, a gate dielectric layer 150, a channel pad 160, an impurity region 105, a conductive layer 170, a dielectric layer 172 on the conductive layer 170, an air gap 175 in the conductive layer 170, and first and second contact plugs 180 and 185.

In particular, in example embodiments, the dielectric layer 172 exposed through the air gap 175 on the conductive layer 170 may be further disposed. The dielectric layer 172 may be disposed at on least a portion of the conductive layer 170 within an open portion OP. In example embodiments, the dielectric layer 172 may be disposed on an entire surface of the conductive layer 170. The dielectric layer 172 may be a layer which is formed as an insulating material is deposited or a portion of the conductive layer 170 is oxidized in a process following a process in which the conductive layer 170 is formed. The dielectric layer 172 may include, for example, a silicon oxide, a silicon nitride, or a metal oxide.

Figure 9:
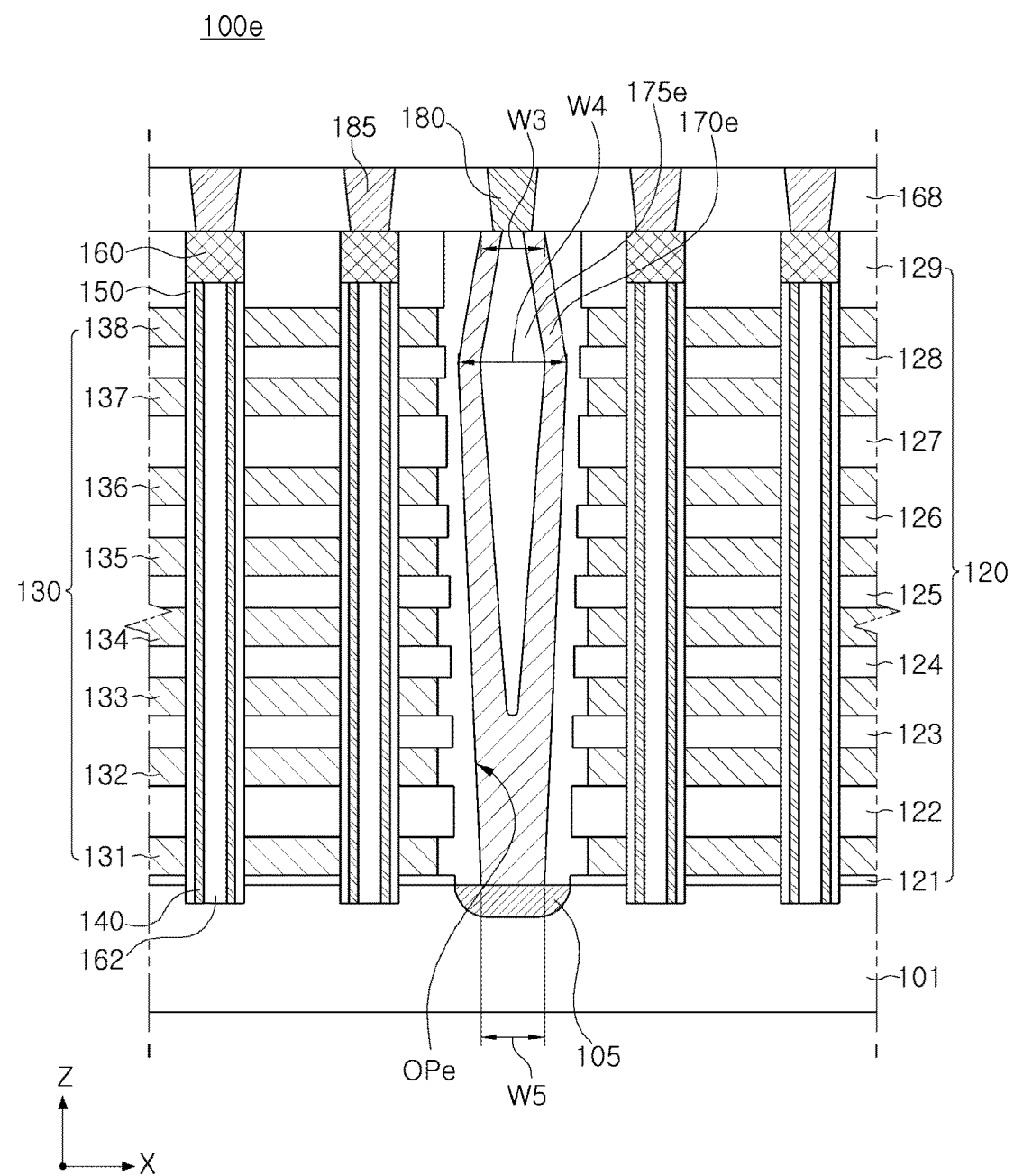

Referring to FIG. 9, a semiconductor device 100e may include a substrate 101, a plurality of channel regions 140, a plurality of interlayer insulating layer 120, a plurality of gate electrodes 130, a gate dielectric layer 150, a channel pad 160, an impurity region 105, a conductive layer 170e, an air gap 175e in the conductive layer 170e, and first and second contact plugs 180 and 185.

In particular, in example embodiments, an open portion OPe may have a bowing region in which a width thereof may increase from an upper portion thereof to a predetermined and/or desired depth and then decrease. Accordingly, a region having a fourth width W4 wider than a third width W3, an entire width of the conductive layer 170e on an upper surface thereof, may exist. The conductive layer 170e may have a fifth width W5 narrower than the fourth width W4 on a lower surface thereof. The fifth width W5 may be narrower than the third width W3, but is not limited thereto. Accordingly, depending on a shape of the conductive layer 170e, the air gap 175e may be formed to be wide in the bowing region.

Such a structure may be formed by etchant transfer behavior due to a relatively high aspect ratio in a process in which the open portion OPe is formed.

FIGS. 10 through 18 are cross-sectional views schematically illustrating a method of manufacturing a semiconductor device according to example embodiments. A region corresponding to a cross section taken along line x-z of the perspective view in FIG. 3 may be illustrated in FIGS. 10 through 18.

Figure 10:
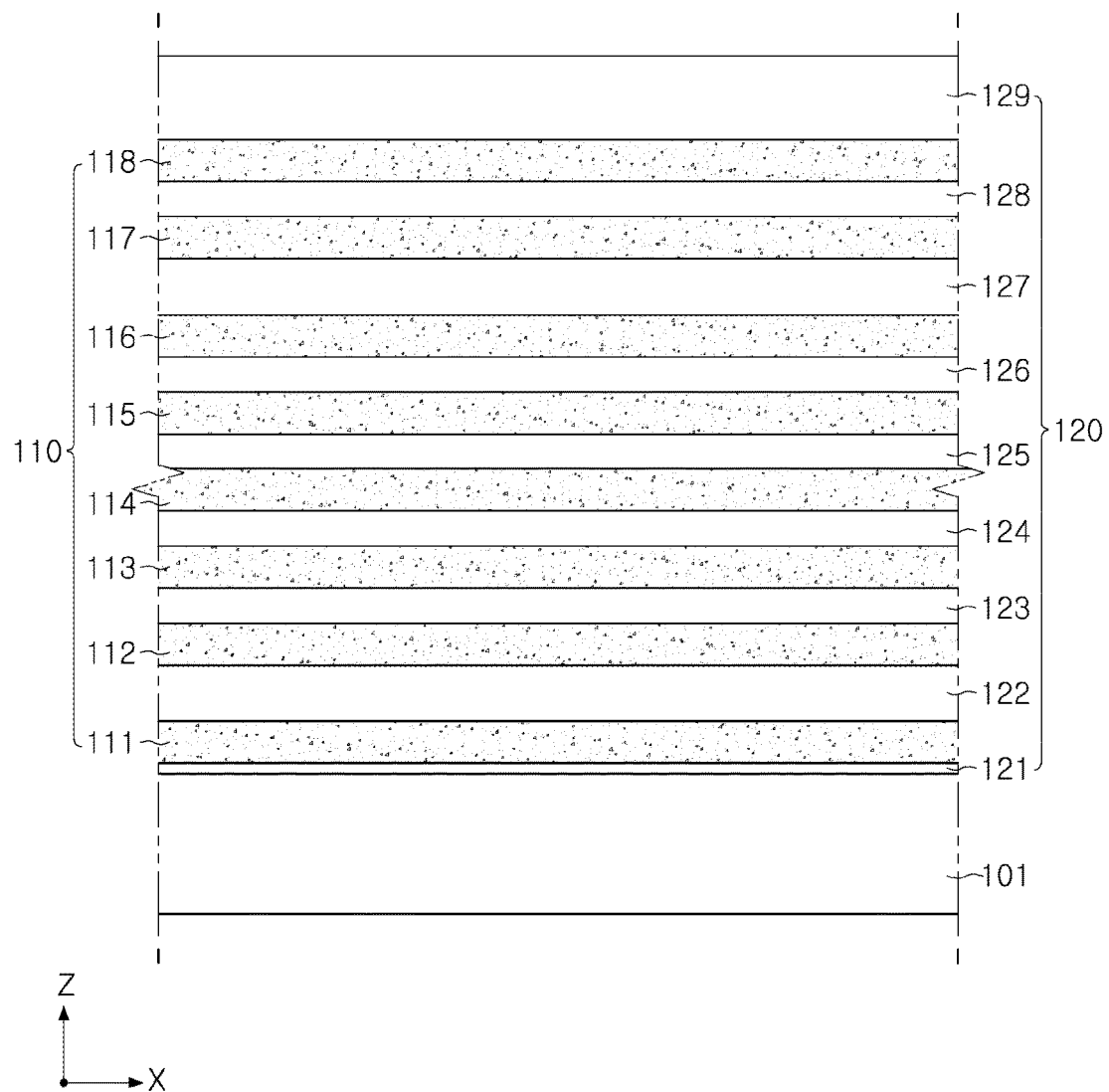
FIGS. 10 through 18 are cross-sectional views schematically illustrating a method of manufacturing a semiconductor device according to example embodiments of inventive concepts.

Referring to FIG. 10, sacrificial layers 111 to 118 collectively represented by 110 and interlayer insulating layers 121 to 129 collectively represented by 120 may be alternately stacked on a substrate 101.

First, the interlayer insulating layers 120 and the sacrificial layers 110 may be alternately stacked on the substrate 101, starting from the first interlayer insulating layer 121 as illustrated in FIG. 10. The sacrificial layers 110 may be formed of a material having an etching selectivity with respect to the interlayer insulating layers 120. In detail, the sacrificial layers 110 may be formed of a material which may be etched while significantly reducing an etching of the interlayer insulating layers 120 in a process in which the sacrificial layers 110 are etched. The etching selectivity or an etching selectivity ratio may be expressed in a quantitative manner using a ratio of an etching rate of the sacrificial layers 110 to an etching rate of the interlayer insulating layers 120. For example, the interlayer insulating layers 120 may be formed of at least one of a silicon oxide and a silicon nitride, and the sacrificial layers 110 may be formed of a material different from the material forming the interlayer insulating layers 120, selected from silicon, a silicon oxide, a silicon carbide, and a silicon nitride.

As illustrated, thicknesses of the interlayer insulating layers 120 may not be identical to each other in example embodiments. The interlayer insulating layer 121, the lowest among the interlayer insulating layers 120, may be formed to be relatively thin, and the interlayer insulating layer 129, the highest among the interlayer insulating layers 120, may be formed to be relatively thick. In example embodiments, the interlayer insulating layer 122 disposed, with reference to FIG. 2, between the ground select transistor GST and the memory cell element MC1, and the interlayer insulating layer 127 disposed, with reference to FIG. 2, between the string select transistor SST and the memory cell element MCn, may be formed to be thicker than interlayer insulating layers 123 to 126 disposed, with reference to FIG. 2, between the memory cell elements MC1 to MCn. Thicknesses of the interlayer insulating layers 120 and the sacrificial layers 110 may be variously changed from the thicknesses illustrated in FIG. 10, and the numbers of layers configuring the interlayer insulating layers 120 and the sacrificial layers 110 may be variously changed.

According to example embodiments, a portion of the substrate 101 corresponding to a lower portion of a region in which the gate electrode 131 (see FIG. 3) will be disposed, may be doped with a predetermined and/or desired amount of impurity for an electrical interaction between an impurity region 105 and the ground select transistor GST.

Figure 11:
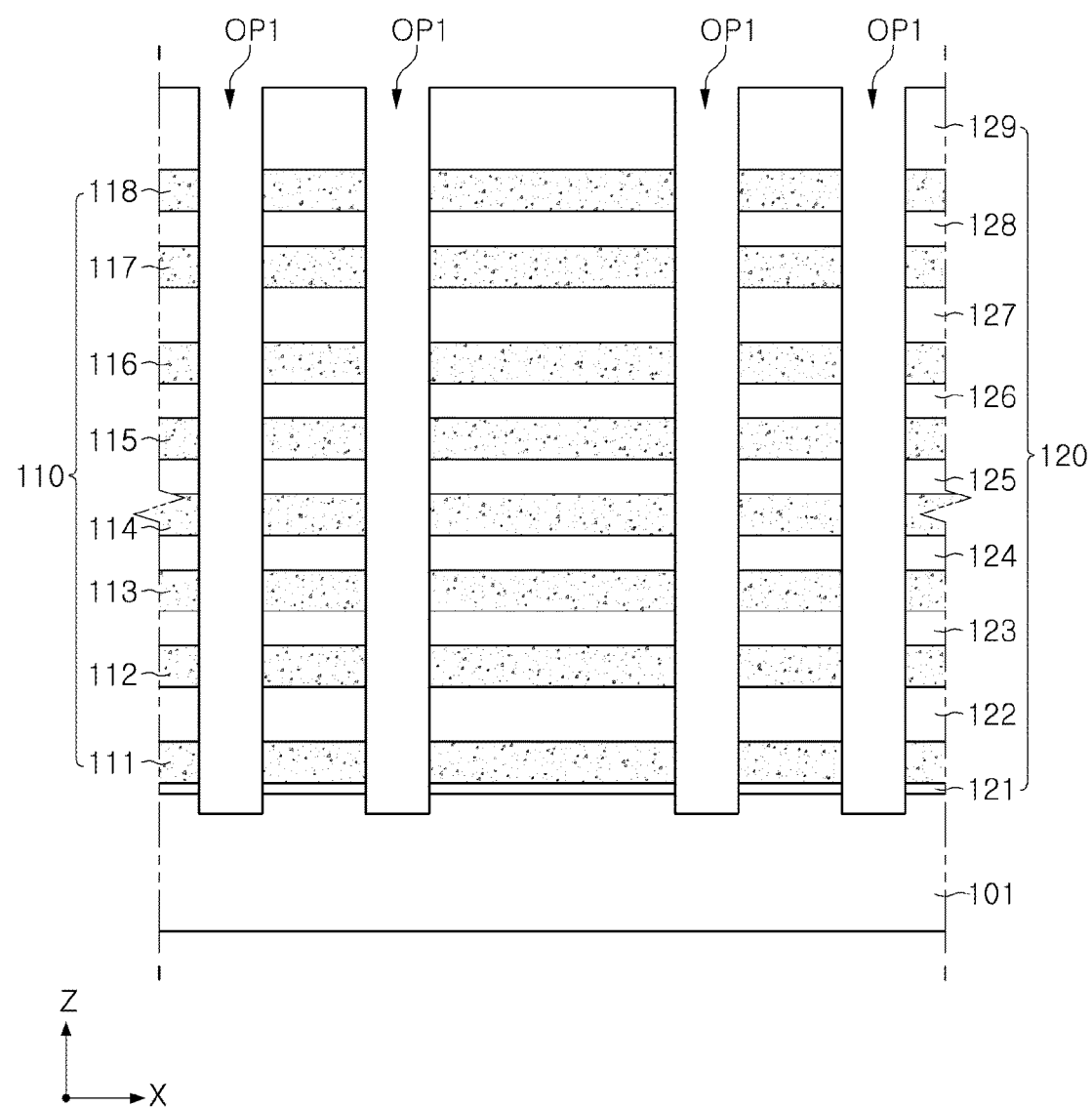

Referring to FIG. 11, first open portions OP1 may be formed to extend perpendicularly in regard to the substrate 101. The first open portions OP1 may be formed in regions corresponding to regions in which the channel regions 140, described in detail with reference to FIG. 3, will be disposed.

The first open portions OP1 may be formed by anisotropically etching the sacrificial layers 110 and the interlayer insulating layers 120. Since a multilayer structure including two kinds of layer is etched, sidewalls of the first open portions OP1 may not be perpendicular to an upper surface of the substrate 101. For example, a width of the first open portions OP1 may decrease as a distance thereof from the upper surface of the substrate 101 decreases. A portion of the substrate 101 may be recessed by the first open portions OP1.

In example embodiments, an epitaxial layer may be further formed on the recessed region in the substrate 101. The epitaxial layer may be formed so that an upper surface thereof is positioned at a height higher than a height of an upper surface of a sacrificial layer 111 which will be replaced by the gate electrode 131 of the ground select transistor GST (see FIG. 2).

Figure 12:
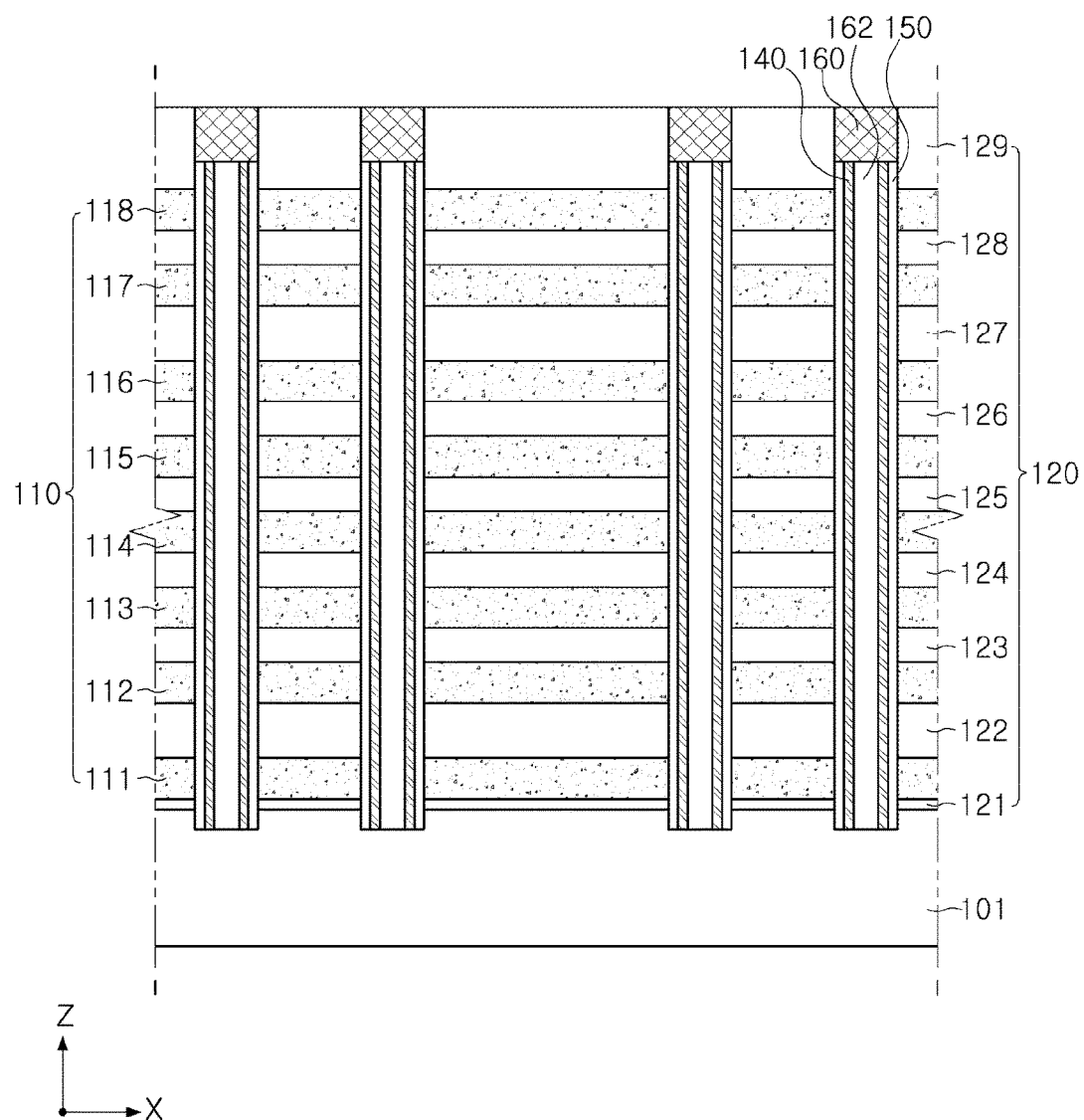

Referring to FIG. 12, a gate dielectric layer 150, the channel region 140, a first insulating layer 162, and a channel pad 160 may be formed in the first open portions OP1.

The gate dielectric layer 150 may be formed to have a constant thickness using an atomic layer deposition (ALD)

process or a chemical vapor deposition (CVD) process. An entirety or a portion of the gate dielectric layer 150 may be formed in this process, and a portion of the gate dielectric layer 150 extending to be perpendicular to the substrate 101 along the channel region 140, as illustrated with reference to FIGS. 4A through 4C, may be formed in this process.

The gate dielectric layer 150 formed on the upper surface of the substrate 101 in the first open portions OP1 may be partially removed so that the channel region 140 is formed to directly contact the substrate 101.

The first insulating layer 162 may be formed to fill the first open portions OP1, and may include an insulating material. In example embodiments, however, the channel region 140 may also be filled with a conductive material, rather than the first insulating layer 162.

The channel pad 160 may be formed of a conductive material. The channel pad 160 may be electrically connected to the channel region 140, and may electrically connect the channel region 140 to the second contact plug 185 (see FIG. 3) to be formed in a subsequent process.

Figure 13:
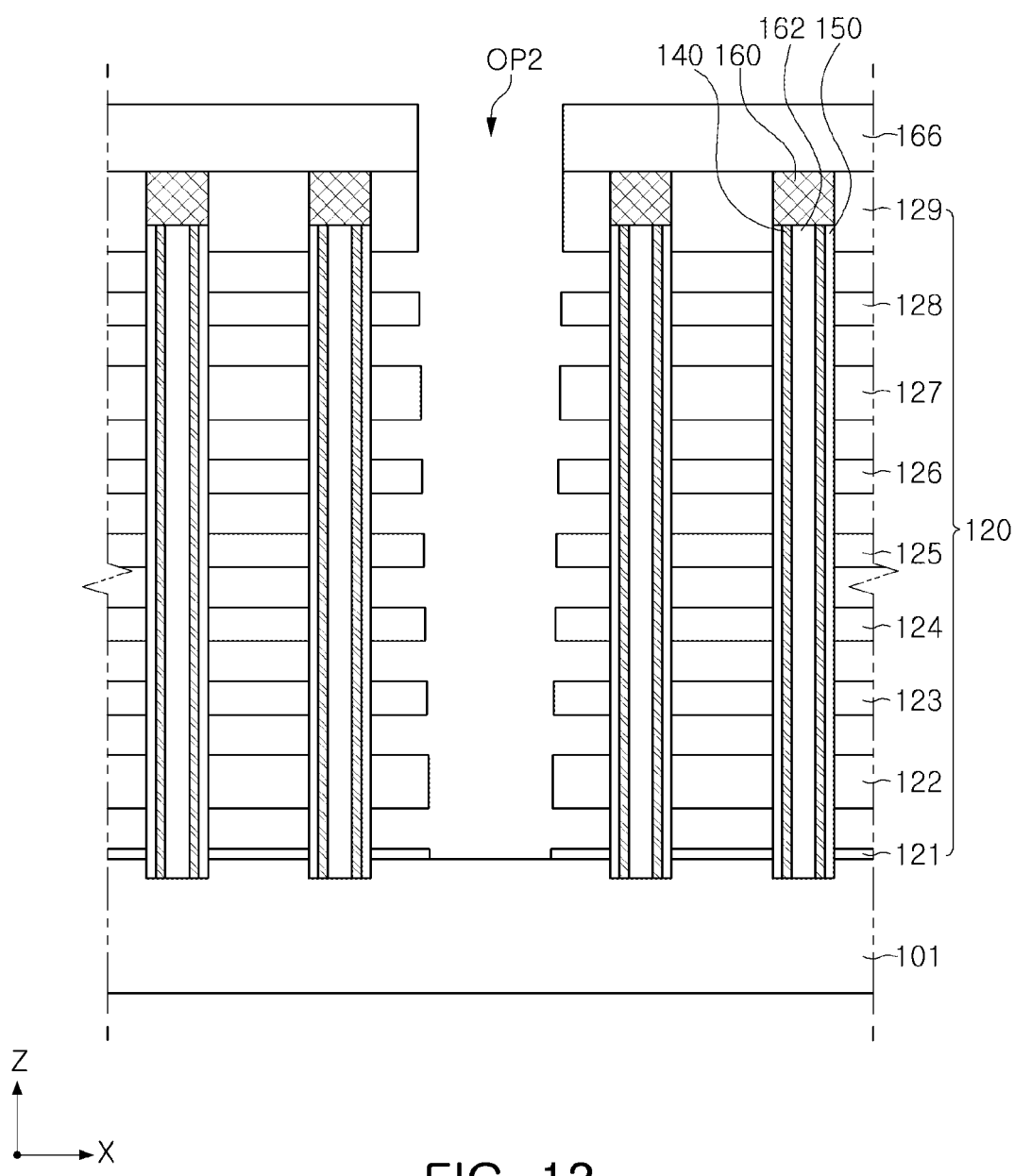

Referring to FIG. 13, a second open portion OP2 separating the multilayer structure formed of the sacrificial layers 110 and the interlayer insulating layers 120 by a predetermined and/or desired distance may be formed, and then the sacrificial layers 110 exposed through the second open portion OP2 may be removed.

Before the second open portion OP2 is formed, a third insulating layer 166 may be additionally formed on the interlayer insulating layer 129, the highest among the interlayer insulating layers 120, and the channel pad 160 so that damage to the channel pad 160, the channel region 140, and the like may be limited (and/or prevented).

The second open portion OP2 may be formed by forming a mask layer using a photolithography process and then anisotropically etching the multilayer structure formed of the sacrificial layers 110 and the interlayer insulating layers 120. The second open portion OP2 may be formed as a trench extending in the y-direction (see FIG. 3). The second open portion OP2 may expose the substrate 101 between two channel regions 140. The sacrificial layers 110 may be removed during an etching process, and accordingly, a plurality of lateral open portions may be formed between the interlayer insulating layers 120. Sidewalls of the gate dielectric layer 150 may be partially exposed through the lateral open portions.

Figure 14:
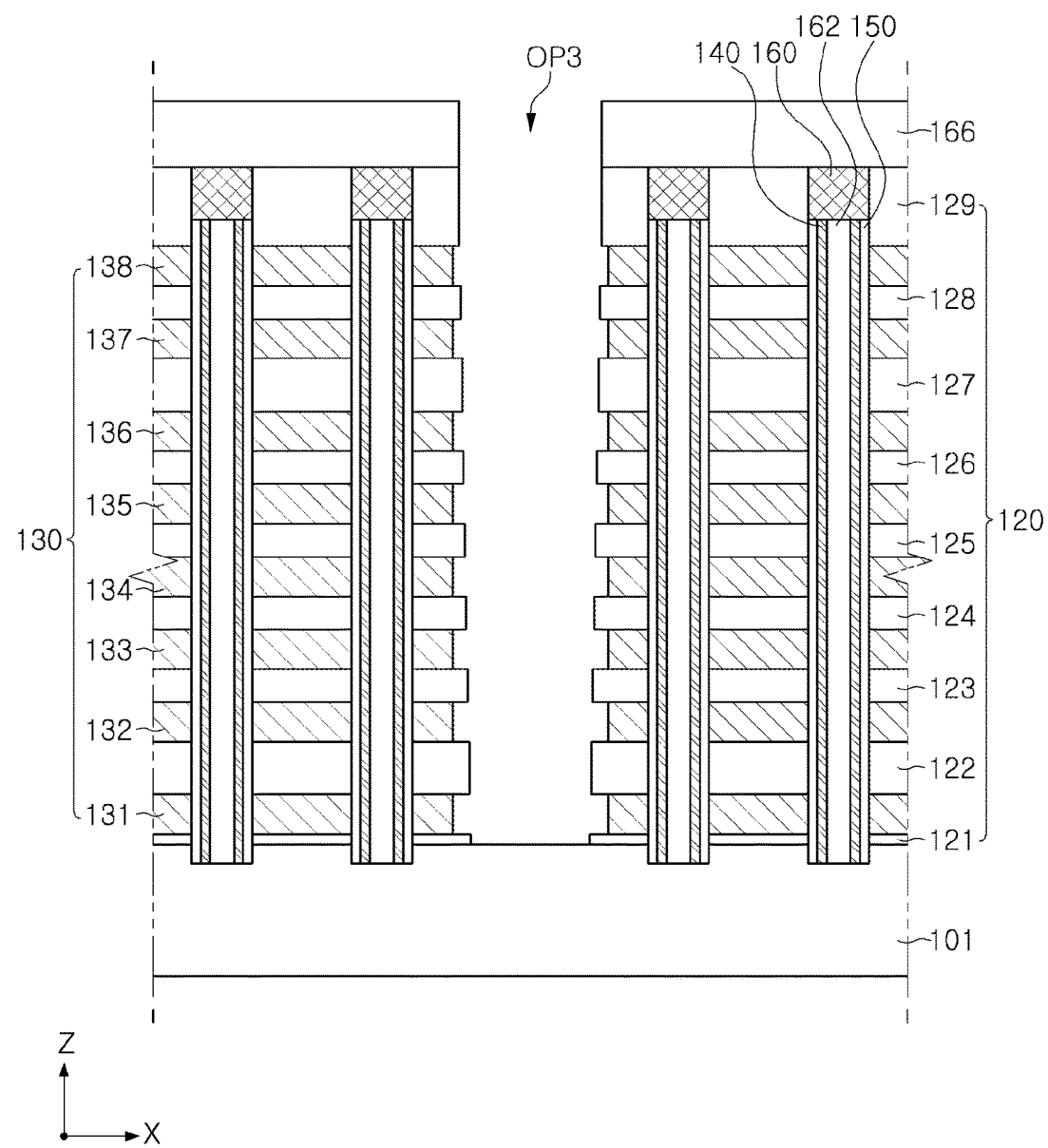

Referring to FIG. 14, the gate electrodes 130 may be formed in the lateral open portions from which the sacrificial layers 110 have been removed, and a third open portion OP3 may be formed.

The gate electrodes 130 may include metal, polycrystalline silicon, or metal silicide material. The metal silicide material may be selected from a group consisting of cobalt (Co), nickel (Ni), hafnium (Hf), platinum (Pt), tungsten (W), and titanium (Ti), or combinations thereof. When the gate electrodes 130 are formed of the metal silicide material, the gate electrodes 130 may be formed by filling the lateral open portions with silicon and forming a separate metal layer to perform a silicidation process.

After the gate electrodes 130 are formed, the third open portion OP3 may be formed by performing an additional process to remove a material forming the gate electrodes 130 formed in the second open portion OP2, so that the gate electrodes 130 are disposed only in the lateral open portions. In this process, the interlayer insulating layers 120 may protrude farther than the gate electrodes 130 towards the third open portion OP3, as illustrated, but are not limited thereto.

Figure 15:
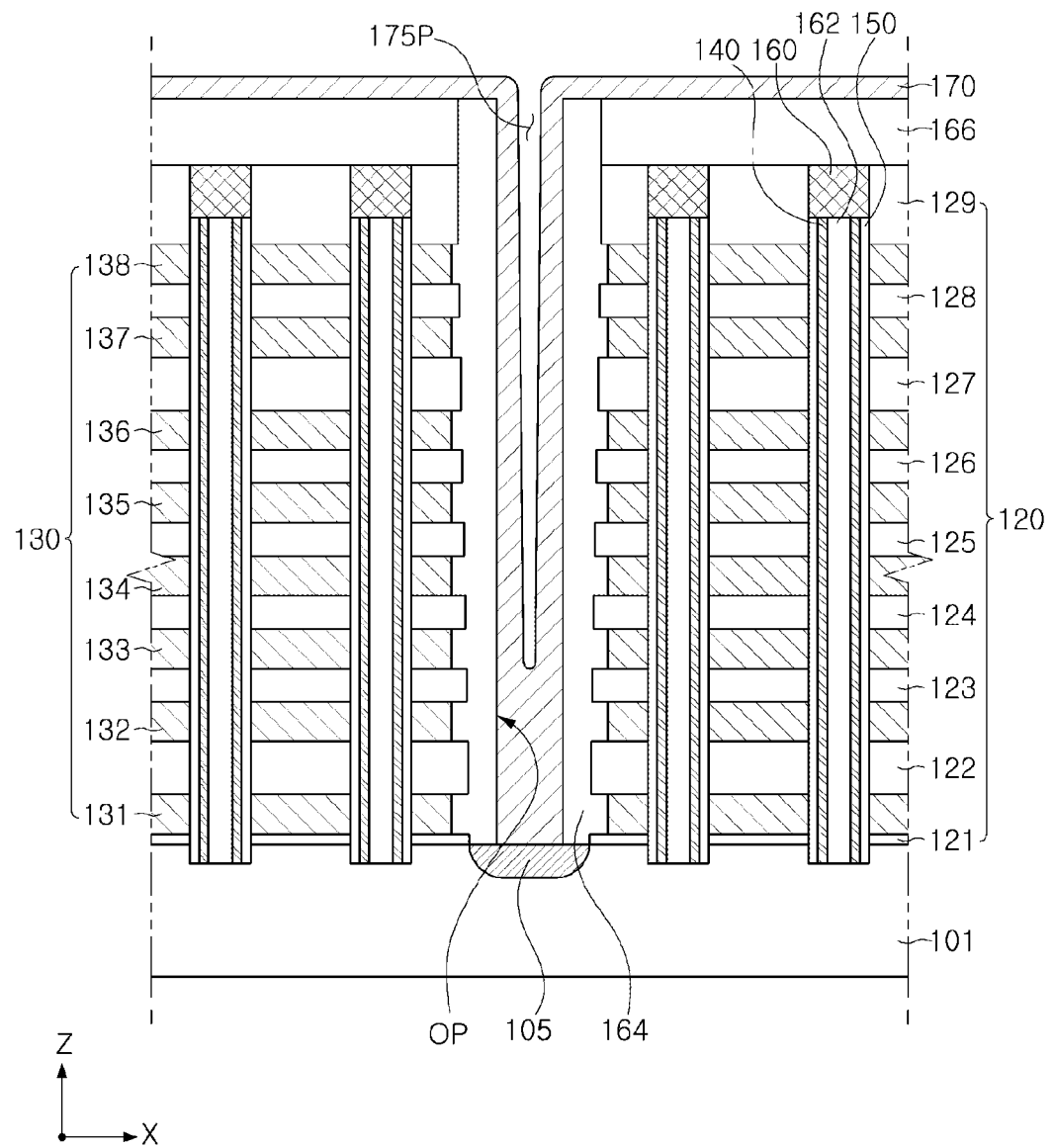

Referring to FIG. 15, the impurity region 105 may be formed in the substrate 101 through the third open portion OP3, and a second insulating layer 164 and a conductive layer 170 may be formed on the impurity region 105.

First, the impurity region 105 may be formed by implanting an impurity into the substrate 101 exposed through the third open portion OP3. Next, the second insulating layer 164 may be formed on a sidewall of the third open portion OP3. The second insulating layer 164 may be formed in a spacer form by forming an insulating material and then removing the insulating material from the substrate 101 so that the upper surface of the substrate 101 is exposed to forming an open portion OP. The open portion OP may have a shape in which a width thereof decreases as a distance thereof from the substrate 101 decreases, due to a relatively high aspect ratio. In example embodiments, the impurity region 105 may be formed after at least a portion of the second insulating layer 164 is formed. In example embodiments, the second insulating layer 164 may have a multilayer structure.

Subsequently, the conductive layer 170 may be formed in the open portion OP defined by the second insulating layer 164. Before the conductive layer 170 is formed, a diffusion barrier layer may be additionally formed on the second insulating layer 164. The diffusion barrier layer may include, for example, a nitride such as TiN and WN.

When the open portion OP has a tapering shape in which a width thereof decreases as a distance thereof from the substrate 101 decreases, the conductive layer 170 may be formed to completely fill the open portion OP to a predetermined and/or desired height from the upper surface of the substrate 101, and from the predetermined and/or desired height, the conductive layer 170 may just cover a sidewall of the open portion OP, and thus, an air gap region 175P may be formed in the conductive layer 170. The air gap region 175P may be provided as a region of which an upper portion is open, unlike a seam. As illustrated above, since the conductive layer 170 may not completely fill the open portion OP, and the air gap region 175P may be formed, a defect occurring due to an outgassing phenomenon which may occur when a seam, a closed space, is formed in the conductive layer 170 may be limited (and/or prevented). For example, in a case in which a source material of the conductive layer 170 in a seam is outgassed in a subsequent process, the second insulating layer 164 may be damaged, and a short circuit between the gate electrodes 130 may occur. However, according to example embodiments, such defects may be limited (and/or prevented).

A thickness of the conductive layer 170 covering a single sidewall of the open portion OP and a width of an open region may be variously changed in example embodiments. The thickness and the width may be determined so that the air gap region 175P is upwardly open while the first contact plug 180 (see FIG. 3) is stably connected to the conductive layer 170 in a subsequent process.

Figure 16:
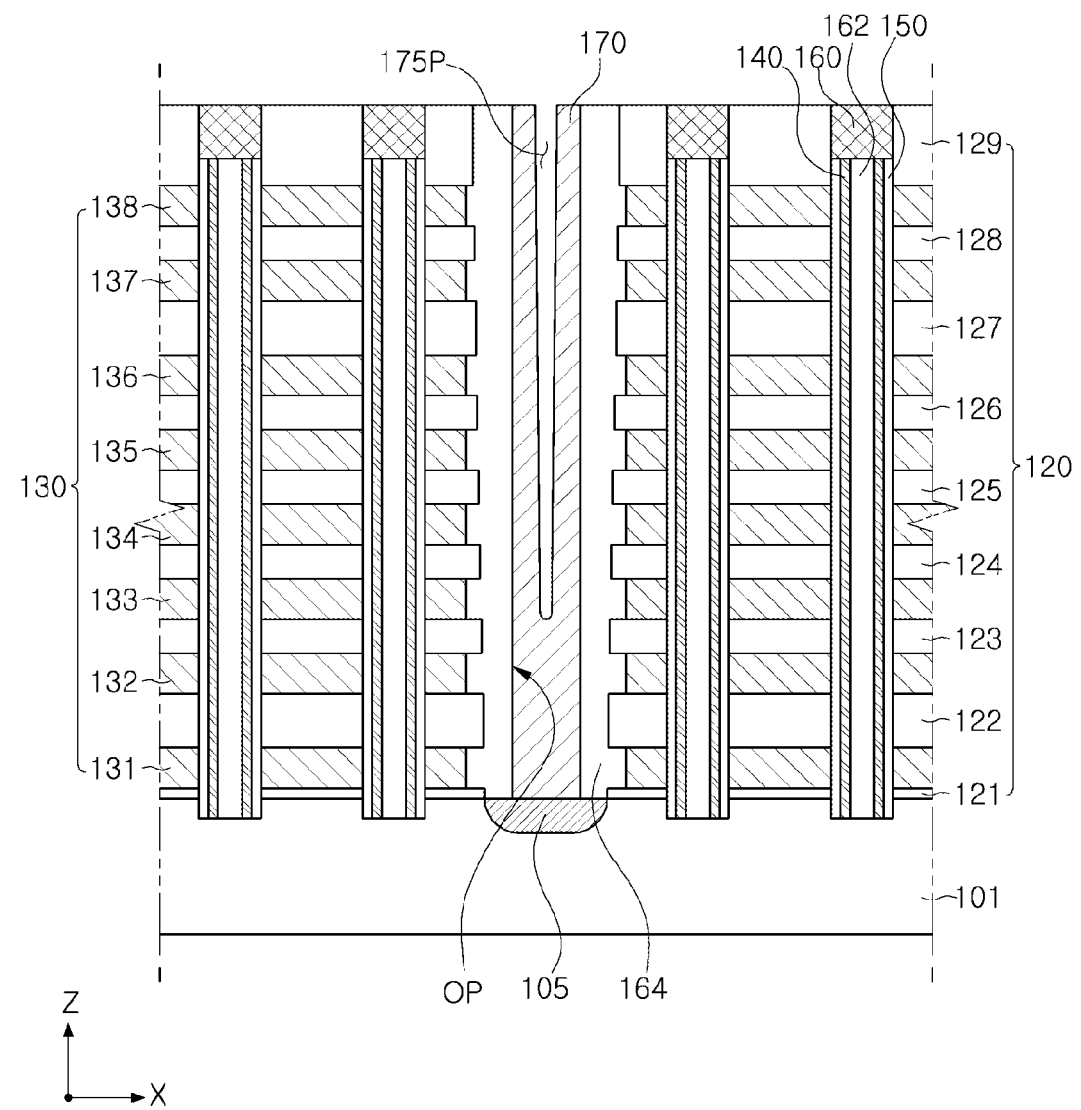

Referring to FIG. 16, a conductive material forming the conductive layer 170 and at least a portion of the third insulating layer 166 may be removed from an upper portion of the open portion OP by a planarization process.

The planarization process may be provided as a chemical mechanical polishing (CMP) process. In example embodiments, the third insulating layer 166 is illustrated as being entirely removed in the planarization process, but a thickness of the third insulating layer 166 being removed is not limited thereto.

Figure 17:
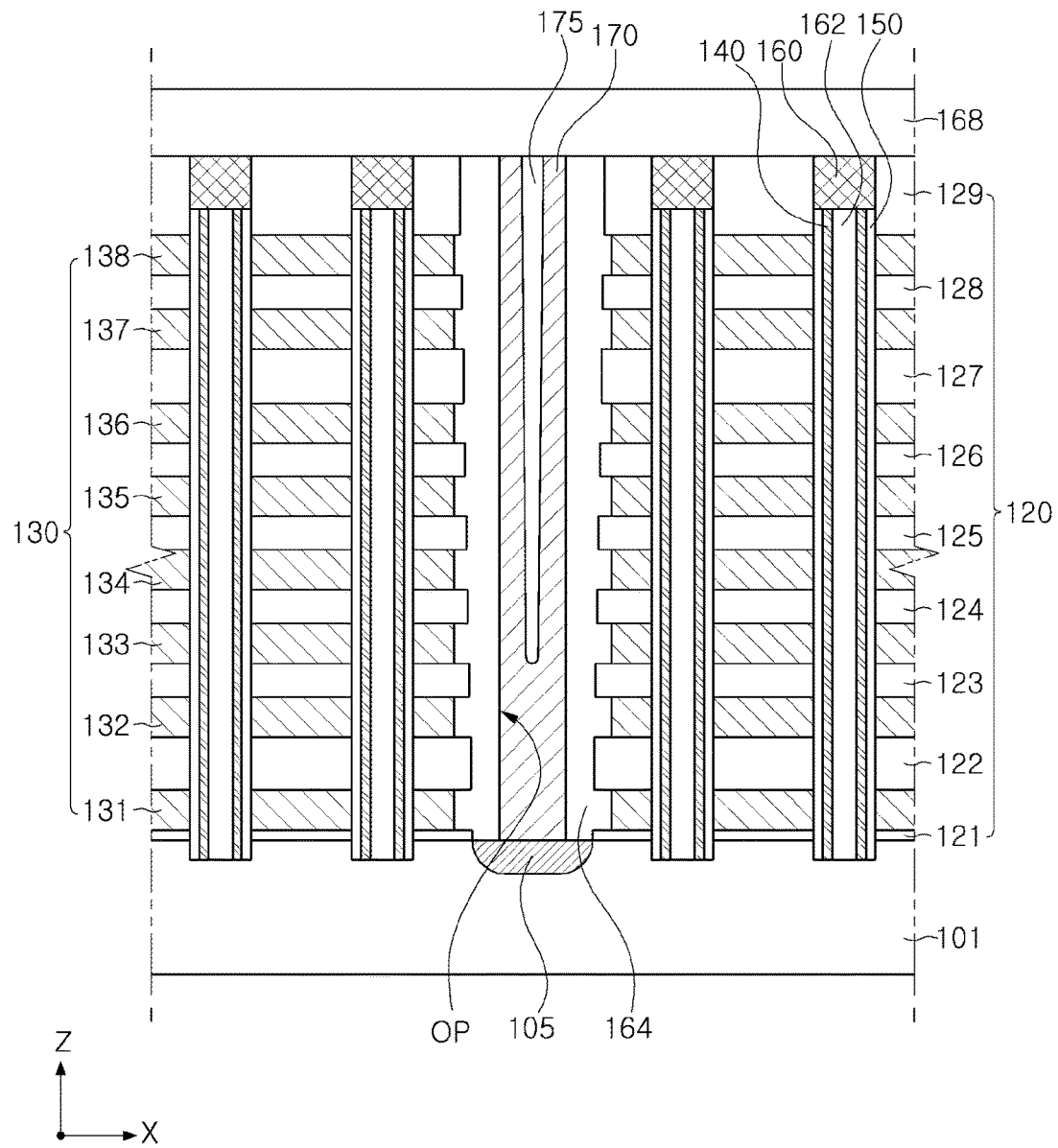

Referring to FIG. 17, an upper insulating layer 168 may be formed on the flattened conductive layer 170. The upper insulating layer 168 may be formed to cover an upper portion of the channel pad 160.

In this process, an upper end of the air gap region 175P may be covered by the upper insulating layer 168, and thus an air gap 175 may be formed. The upper insulating layer 168 may be formed using a material and/or a deposition process for forming a layer having a poor step coverage characteristic. In detail, the upper insulating layer 168 may be formed to have a poor step coverage characteristic, and thus, the air gap 175 may be formed without the material of the upper insulating layer 168 flowing in the open portion OP.

In a case in which a portion of the material of the upper insulating layer 168 flows into the open portion OP in this process, the material of the upper insulating layer 168 may form the dielectric layer 172 described with reference to FIG. 8.

Figure 18:
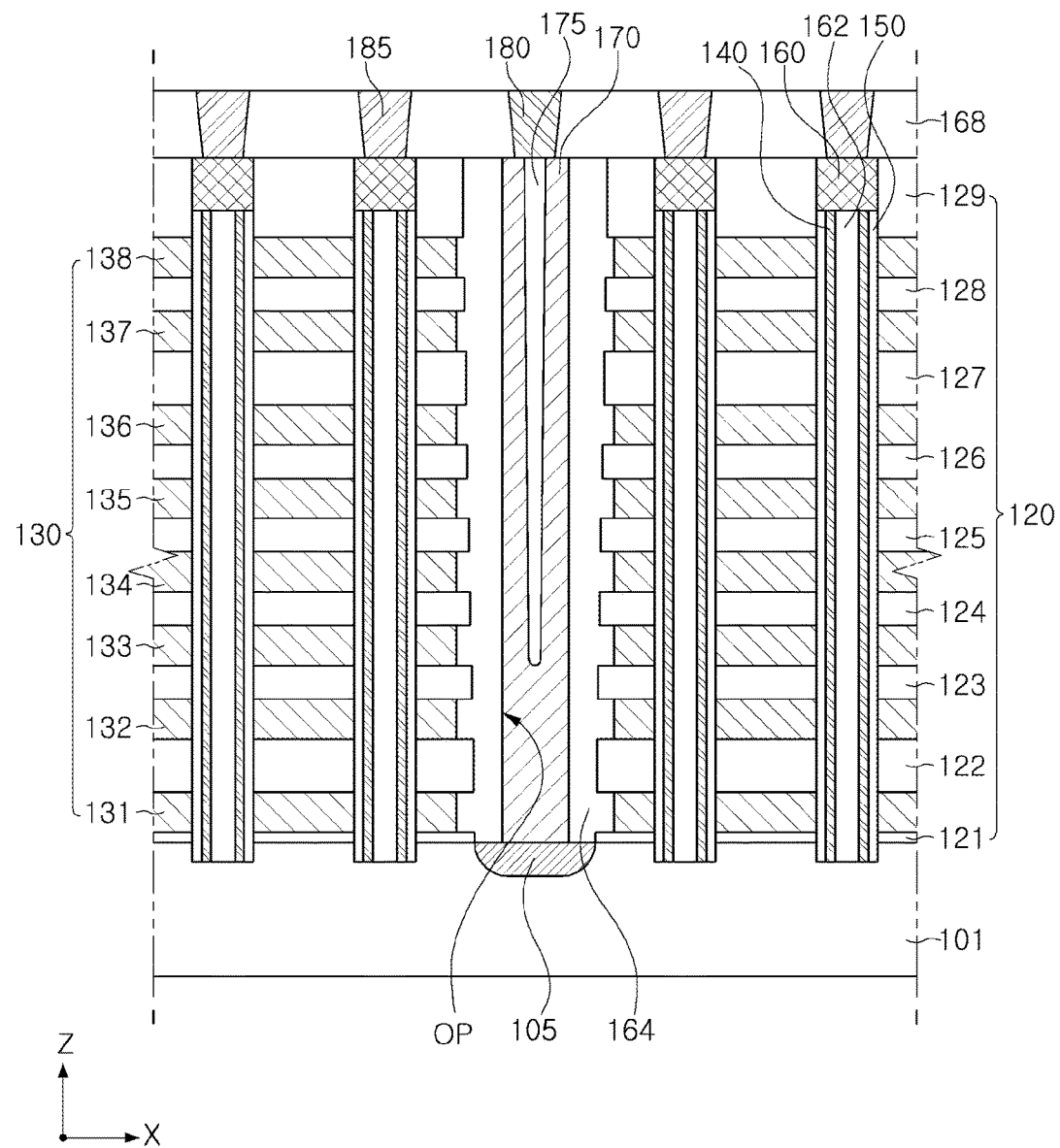

Referring to FIG. 18, first and second contact plugs 180 and 185 respectively connected to the conductive layer 175 and the channel pads 160 may be formed to penetrate through the upper insulating layer 168.

After contact holes penetrating through the upper insulating layer 168 are formed, a conductive material may be deposited in the contact holes, such that the first and second contact plugs 180 and 185 are formed. The first and second contact plugs 180 and 185 may include, for example, tungsten (W), aluminum (Al), or copper (Cu).

The first contact plugs 180 may be formed to be spaced apart from each other by a predetermined and/or desired distance on an upper end of the air gap 175 in the y-direction (see FIG. 4). The first contact plugs 180 may contact the conductive layer 170 on both sides thereof to be electrically connected thereto while covering the upper end of the air gap 175.

In example embodiments, the second contact plugs 185 may not be formed on some channel pads 160, or may be formed as dummy contact plugs. For example, the second contact plugs 185 may not be formed in a region of an x-direction line of the first contact plugs 180, or in a region adjacent to the x-direction line of the first contact plugs 180.

Figure 19:
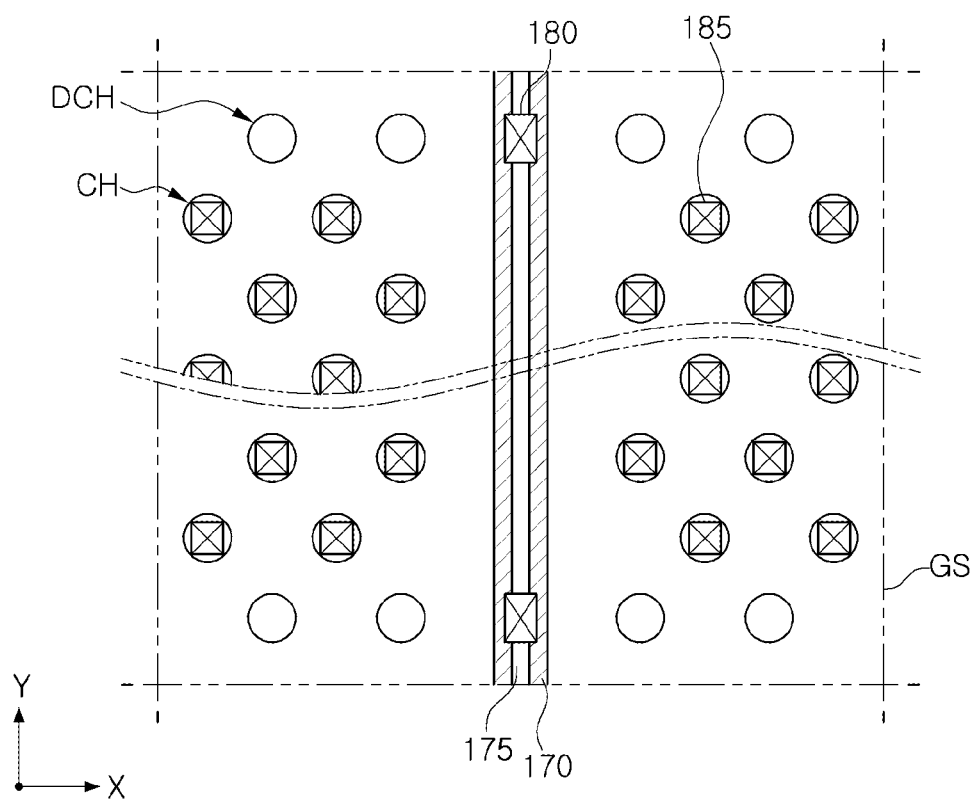
FIG. 19 is a plan view provided to illustrate a wiring structure of a semiconductor device according to example embodiments of inventive concepts.

FIG. 19 is a plan view provided to describe a wiring structure of a semiconductor device according to example embodiments.

Referring to FIG. 19, a gate multilayer structure GS, a plurality of channel regions CH disposed to penetrate through the gate multilayer structure GS, a conductive layer 170 disposed in a direction such as a y-direction between two adjacent gate multilayer structures GS, and first and second contact plugs 180 and 185 respectively disposed on the conductive layer 170 and the channel regions CH may be provided.

The gate multilayer structure GS may include the gate electrodes 130 (see FIG. 3) of the transistors of the plurality of memory cell arrays stacked in a direction not illustrated. The channel regions CH may penetrate through the gate multilayer structure GS while including the channel regions 140 (see FIG. 3). The conductive layer 170 may extend in a y-direction, and an air gap 175 may be disposed in the conductive layer 170.

The first contact plugs 180 may be disposed on the conductive layer 170 in the y-direction to be space apart from each other by a predetermined and/or desired distance. The second contact plugs 185 may be disposed on the channel regions CH. In example embodiments, a y-direction length of the first contact plugs 180 is illustrated as being longer than a y-direction length of the second contact plugs 185, but relative sizes of the first and second contact plugs 180 and 185 are not limited thereto.

The first and second contact plugs 180 and 185 may be connected respectively to wiring lines extending in the x-direction or the y-direction. For example, when the first contact plugs 180 are connected to the wiring line extending in the x-direction, the second contact plugs 185 may not be disposed on the channel regions CH arrayed side by side with the first contact plugs 180 as illustrated, so that the first contact plugs 180 and the second contact plugs 185 are not connected to a single wiring line. Thus, the channel regions CH arrayed side by side with the first contact plugs 180 may be referred to as dummy channel regions DCH.

However, dispositions of the second contact plugs 185 may not be limited thereto, and the second contact plugs 185 may be disposed on the dummy channel regions DCH as dummy contact plugs. In this case, the dummy channel regions DCH and the conductive layer 170 may not be connected to each other through an arrangement of the wiring structures above the first and second contact plugs 180 and 185.

Figure 20:
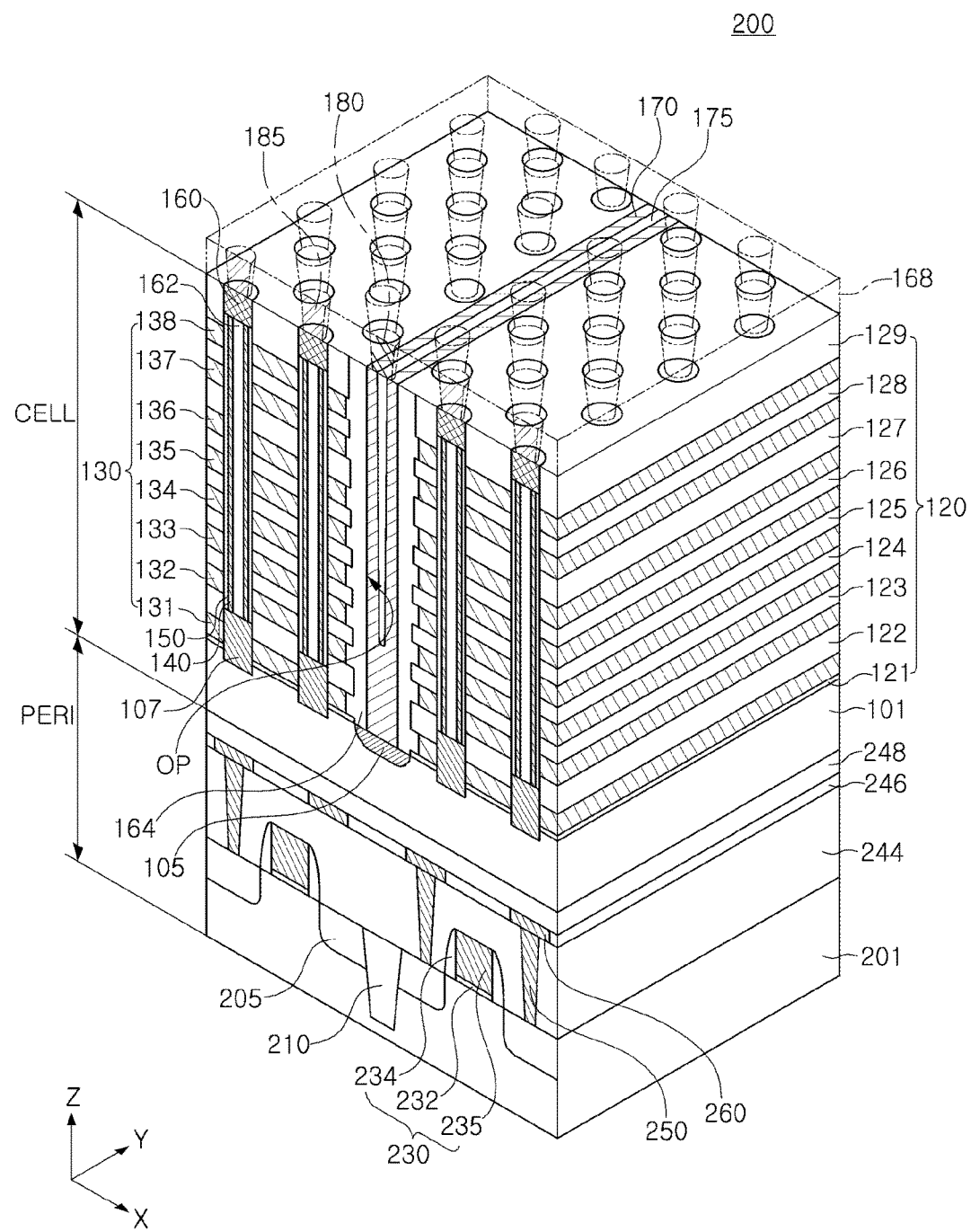
FIG. 20 is a perspective view schematically illustrating a semiconductor device according to example embodiments of inventive concepts.

FIG. 20 is a perspective view schematically illustrating a semiconductor device according to example embodiments. Referring to FIG. 20, a semiconductor device 200 may include a cell region CELL and a peripheral circuit region PERI.

The cell region CELL may be a region in which the memory cell array 20 of FIG. 1 is disposed, and the peripheral circuit region PERI may be a region in which the driving circuit 30 of the memory cell array 20 of FIG. 1 is disposed. The cell region CELL may be disposed on the peripheral circuit region PERI. According to example embodiments, the cell region CELL may be disposed under the peripheral circuit region PERI.

The cell region CELL may include a substrate 101, a plurality of channel regions 140 disposed to be perpendicular to an upper surface of the substrate 101, an epitaxial layer 107 disposed below the channel regions 140, and a plurality of interlayer insulating layers 120 and a plurality of gate electrodes 130 stacked along outside walls of the channel regions 140. In addition, the semiconductor device 200 may further include a gate dielectric layer 150 disposed between the channel regions 140 and the gate electrodes 130, a channel pad 160 disposed on an upper portion of the channel regions 140, an impurity region 105, a conductive layer 170 on the impurity region 105, an air gap 175 in the conductive layer 170, and first and second contact plugs 180 and 185.

The epitaxial layer 107 may be disposed on the substrate 101 below the channel regions 140, and on a side surface of at least one of the gate electrodes 130. The epitaxial layer 107 may be disposed in a recessed region of the substrate 101. An upper surface of the epitaxial layer 107 may be positioned at a height higher than that of an upper surface of a gate electrode 131, the lowest among the gate electrodes 130, and at a height lower than that of a lower surface of a gate electrode 132 disposed above the lowest gate electrode 131. Due to the epitaxial layer 107, even in a case in which an aspect ratio of the channel regions 140 increases, the channel regions 140 may be stably electrically connected to the substrate 101, and characteristics of ground select transistors GST between memory cell strings may become uniform.

The epitaxial layer 107 may be a layer formed using a selective epitaxial growth SEG process. The epitaxial layer 107 may be provided as a single layer structure or a multilayer structure. The epitaxial layer 107 may include polycrystalline silicon, single crystal silicon, polycrystalline germanium, or single crystal germanium, doped or undoped with an impurity. For example, when the substrate 101 includes single crystal silicon, the epitaxial layer 107 may also include single crystal silicon. However, even when the substrate 101 includes single crystal silicon, at least a portion of the epitaxial layer 107 may have a structure of polycrystalline silicon including a plurality of crystal grains.

In example embodiments, the cell region CELL, except for the epitaxial layer 107, is illustrated as having the same structure as a structure illustrated in FIG. 3, but is not limited thereto. The cell region CELL may include a semiconductor device according to various example embodiments described with reference to FIGS. 5 through 9. In addition, the epitaxial layer 107 may be applied to various example embodiments described with reference to FIG. 3 and FIGS. 5 through 9.

The peripheral region PERI may include an underlying substrate 201, circuit devices 230 disposed on the underlying substrate 201, contact plugs 250, and wiring lines 260.

The underlying substrate 201 may have an upper surface extending in an x-direction and a y-direction. As a device isolation layer 210 is formed, an active region may be defined in the underlying substrate 201. A doped region 205 including an impurity may be disposed in a portion of the active region. The underlying substrate 201 may include a semiconductor material such as that of a group IV semiconductor, a group III-V compound semiconductor, or a group II-VI oxide semiconductor.

The circuit devices 230 may include a planar transistor. Respective circuit devices 230 may include a circuit gate insulating layer 232, a spacer layer 234, and a circuit gate electrode 235. The doped region 205 may be disposed in the underlying substrate 201 on both sides of the circuit gate electrode 235 to serve as a source region or a drain region of the circuit device 230.

A plurality of peripheral region insulating layers 244, 246, and 248 may be disposed on the circuit devices 230 on the underlying substrate 201.

The contact plugs 250 may penetrate through the peripheral region insulating layer 244 to be connected to the doped region 205. An electrical signal may be applied to the circuit device 230 by the contact plugs 250. In a region not illustrated, the circuit gate electrode 235 may be connected to the contact plugs 250. The wiring lines 260 may be connected to the contact plugs 250 and may be provided to have a multilayer structure in example embodiments.

After the peripheral circuit region PERI is manufactured first, the cell region CELL may be manufactured as the substrate 101 of the cell region CELL is formed on the peripheral circuit region PERI. A size of the substrate 101 may be the same as or smaller than a size of the underlying substrate 201. The substrate 101 may be formed of polycrystalline silicon, or may be single crystallized after being formed of amorphous silicon.

The cell region CELL and the peripheral circuit region PERI may be connected to each other in a region not illustrated. For example, one end of the gate electrodes 130 in the y-direction may be electrically connected to the circuit device 230. In this case, a contact structure connecting the cell region CELL and the peripheral circuit region PERI may be formed to include a conductive layer and an air gap like the conductive layer 170 and the air gap 175 having an open upper portion.

Figure 21:
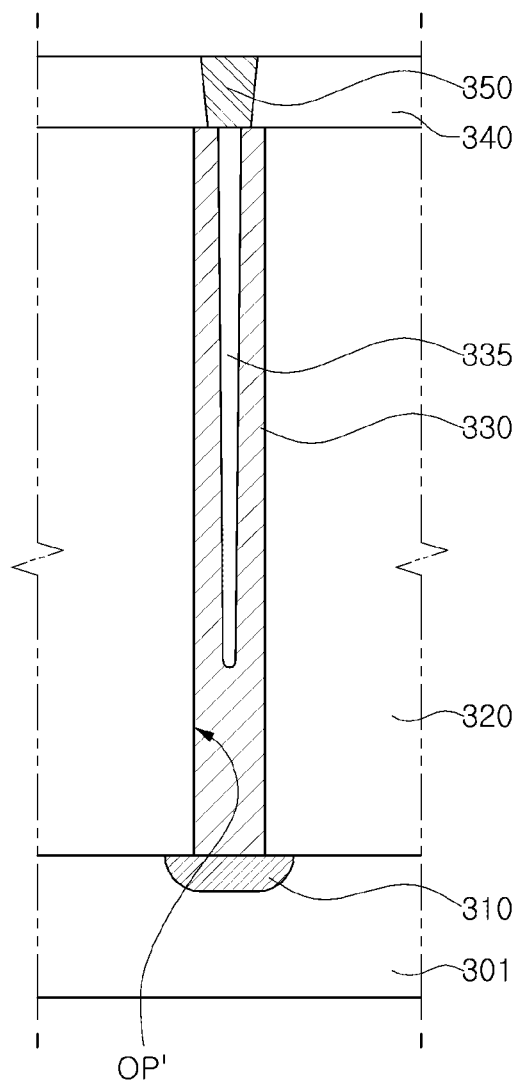
FIG. 21 is a cross-sectional view schematically illustrating a semiconductor device according to example embodiments of inventive concepts.

FIG. 21 is a cross-sectional view schematically illustrating a semiconductor device according to example embodiments.

Referring to FIG. 21, a semiconductor device 300 may include a substrate 301, a first insulating layer 320 and a second insulating layer 340 disposed on the substrate 301, a conductive layer 330 disposed in the first insulating layer 320, and a contact plug 350 connected to the conductive layer 330. The conductive layer 330 may fill a portion of a first open portion OP' in the first insulating layer 320, and an air gap 335 may be formed in the conductive layer 330.

The substrate 301 may include a semiconductor material such as that of a group IV semiconductor, a group III-V compound semiconductor, or a group II-VI oxide semiconductor. The substrate 301 may include a semiconductor substrate and some components of a semiconductor device formed on the semiconductor substrate. The substrate 301 may include at least a portion of one or more semiconductor devices. The semiconductor device may be provided as a memory device such as a dynamic random access memory (DRAM) device, a static random access memory (SRAM) device, a spin transfer torque magnetic random access memory (STT-MRAM) device, and a flash memory device, or a non-memory device such as a logic device. For example, the semiconductor device 300 may include a transistor, a resistor, and a wiring.

The substrate 301 may include a conductive region 310, and the conductive region 310 may be disposed to be exposed through an upper surface of the substrate 301. A shape of the conductive region 310 is illustrated as an example, and the conductive region 310 may be any one of an impurity region, an electrode, and a wiring.

The first insulating layer 320 may include the first open portion OP' exposing the conductive region 310. The first open portion OP' may have a hole or linear shape. When the first open portion OP' has the linear shape, the open portion OP' may be formed to extend to be perpendicular to the cross section illustrated in FIG. 21. The second insulating layer 340 may be disposed to cover an upper surface of the conductive layer 330.

The first and second insulating layers 320 and 340 may be formed of an insulating material. For example, the first and second insulating layers 320 and 340 may include a silicon dioxide ($SiO_2$).

The conductive layer 330 may be disposed to cover a sidewall of the first open portion OP' of the first insulating layer 320 and fill a portion of the first open portion OP', and may include a conductive material. The conductive layer 330 may have a relatively high aspect ratio. For example, the conductive layer 330 may have an aspect ratio ranging from 1:5 to 1:30.

The air gap 335 may be formed in a portion of the first open portion OP' which has not been completely filled with the conductive layer 330. A lower end and sides of the air gap 335 may be defined by the conductive layer 330, and an upper end of the air gap 335 may be defined by the contact plug 350. When the first open portion OP' has a linear shape, and the contact plug 350 has a cylindrical shape, the upper end of the air gap 335 in a region in which the contact plug 350 has not been disposed may be defined by the second insulating layer 340.

In example embodiments, since the air gap 335 having an open upper portion is formed in the conductive layer 330, a defect occurring due to an outgassing phenomenon which may occur when a seam, a closed space, is formed in the conductive layer 330 may be limited (and/or prevented).

The contact plug 350 may cover the upper end of the air gap 335 and directly contact the conductive layer 330 on both sides of the air gap 335 to be connected to the conductive layer 330. The contact plug 350 may have a cylindrical shape or a linear shape, and may include a conductive material. The contact plug 350 is illustrated as having a width narrower than an entire width of the conductive layer 330 including both ends thereof, but is not limited thereto.

FIGS. 22 through 25 are cross-sectional views schematically illustrating a method of manufacturing a semiconductor device according to example embodiments. The views of FIGS. 22 through 25 are provided to describe a method of manufacturing the semiconductor device 300 of FIG. 21 by way of example.

Figure 22:
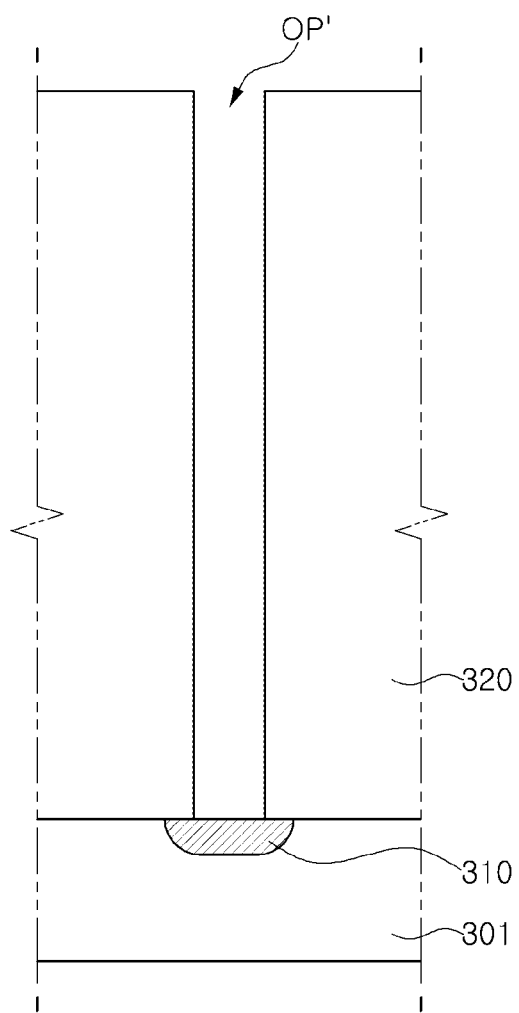
FIGS. 22 through 25 are cross-sectional views schematically illustrating a method of manufacturing a semiconductor device according to example embodiments of inventive concepts.

Referring to FIG. 22, a first insulating layer 320 may be formed on a substrate 301, and a first open portion OP' penetrating through the first insulating layer 320 and exposing a conductive layer 310 may be formed.

In example embodiments, a recess may be formed in the substrate 301 when the first open portion OP' is formed.

Figure 23:
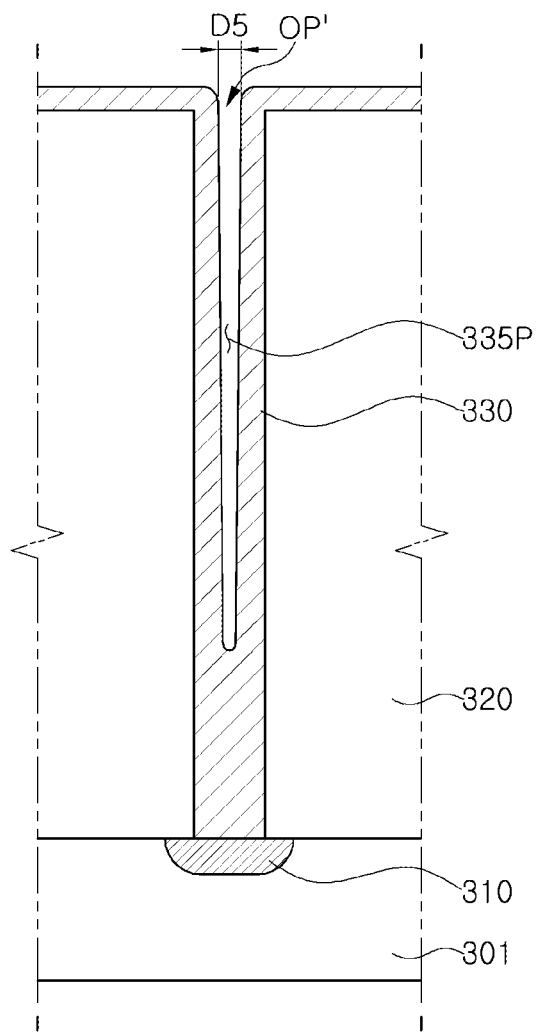

Referring to FIG. 23, the conductive layer 330 may be formed in the first open portion OP'.

The conductive layer 330 may fill a lower portion of the first open portion OP' to a predetermined and/or desired height, and above the predetermined and/or desired height, cover sidewalls of the first open portion OP'. Accordingly, an air gap region 335P may be formed in the conductive layer 330. An upper portion of the air gap region 335P may be open by a length D5, and the open length may decrease as a distance thereof from the substrate 301 decreases. In example embodiments, on both sides of the upper portion of the air gap region 335P, the conductive layer 330 may have an overhang structure and include a relatively thick region.

Figure 24:
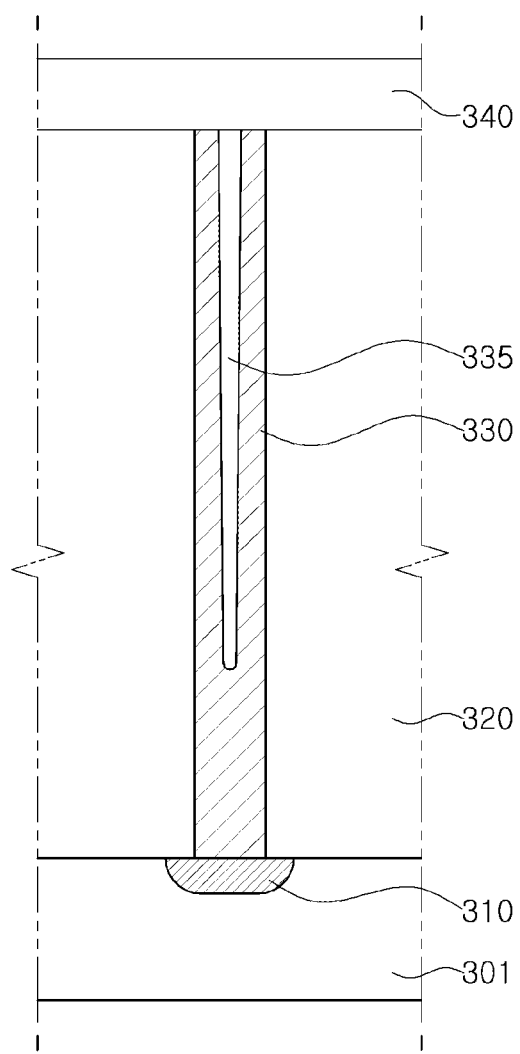

Referring to FIG. 24, a material forming the conductive layer 330 may be removed from on the first insulating layer 320 around the first open portion OP', to form a second insulating layer 340.

The conductive layer 330 on the first insulating layer 320 may be removed using a planarization process such as a chemical mechanical polishing (CMP) process. The second insulating layer 340 may be formed to cover the conductive layer 330 and the air gap region 335P, which may allow an air gap 335 to be formed. The second insulating layer 340 may be formed using a material and/or a deposition process for forming a layer having a relatively poor step coverage characteristic. Accordingly, the air gap region 335P may not be filled with a material forming the second insulating layer 340.

Figure 25:
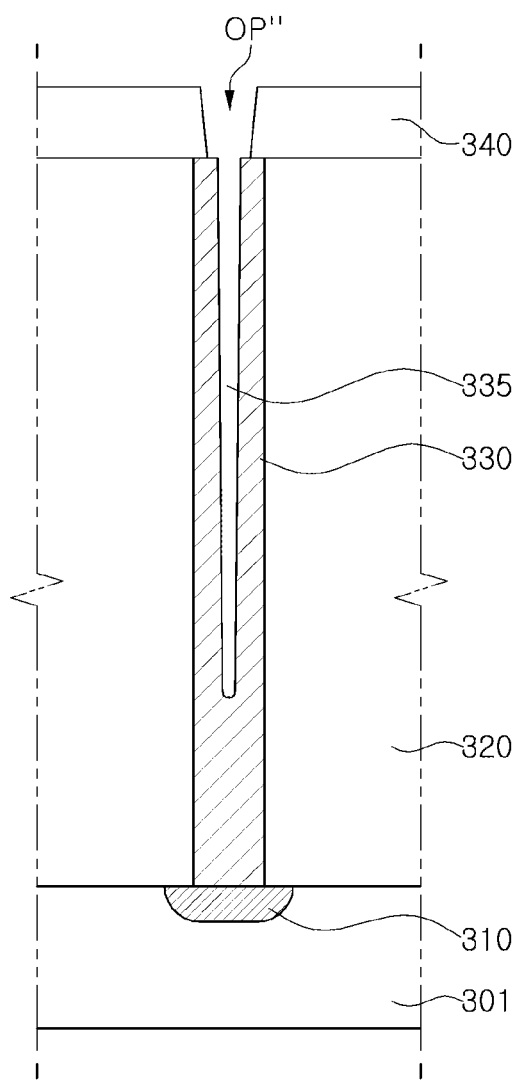

Referring to FIG. 25, a second open portion OP'' penetrating through the second insulating layer 340 may be formed.

The second open portion OP'' may be formed so that at least a portion of an upper surface of the conductive layer 330 is exposed and the air gap 335 is open. Accordingly, in a region in which the second open portion OP'' is formed, the air gap 335 may be open.

Subsequently, together with reference to FIG. 21, a contact plug 350 may be formed by filling the second open portion OP'' with a conductive material. Accordingly, an upper end of the air gap 335 may be covered by the contact plug 350.

Figure 26:
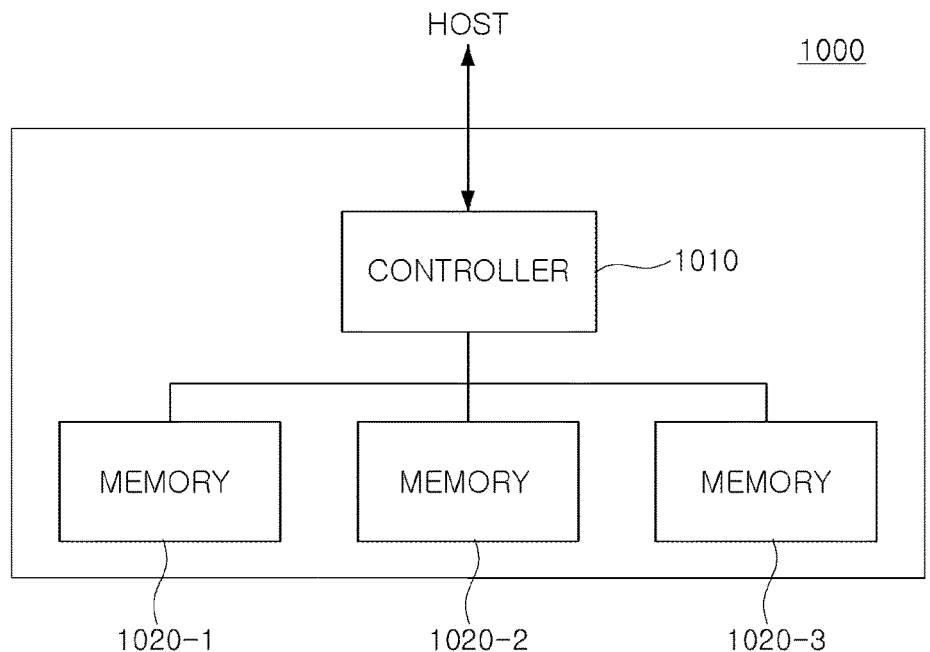
FIG. 26 is a block diagram illustrating a storage device including a semiconductor device according to example embodiments of inventive concepts.

FIG. 26 is a block diagram illustrating a storage device including a semiconductor device according to example embodiments.

Referring to FIG. 26, a storage device 1000, according to example embodiments, may include a controller 1010 communicating with a HOST, and memories 1020-1, 1020-2, and 1020-3 storing data. Each of the memories 1020-1, 1020-2, and 1020-3 may include a semiconductor device according to example embodiments described above with reference to FIGS. 3 through 9.

The HOST communicating with the controller 1010 may be provided as various types of electronic devices having the storage device 1000, such as smartphones, digital cameras, desktop computers, laptop computers, media players, and the like. The controller 1010 may receive a request for writing data or reading data from the HOST, and may generate a command CMD to store data in the memories 1020-1, 1020-2, and 1020-3 or retrieve data from the memories 1020-1, 1020-2, and 1020-3.

As illustrated in FIG. 26, one or more memories 1020-1, 1020-2, and 1020-3 may be connected to the controller 1010 in parallel in the storage device 1000. The storage device 1000 with relatively high capacity such as a solid state drive (SSD) may be implemented by connecting a plurality of the memories 1020-1, 1020-2, and 1020-3 to the controller 1010 in parallel.

Figure 27:
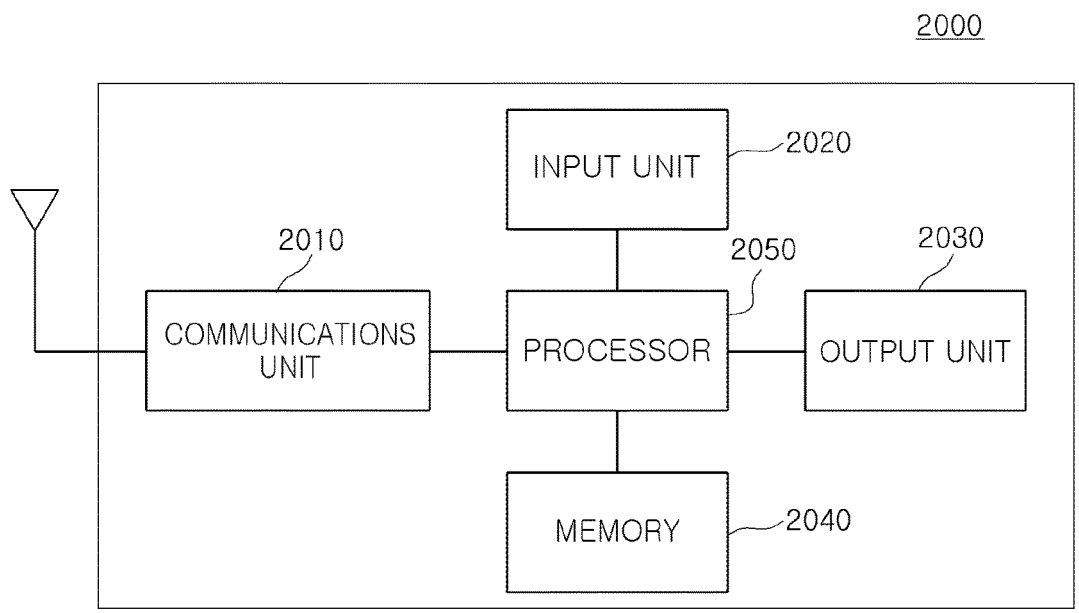
FIG. 27 is a block diagram illustrating an electronic device including a semiconductor device according to example embodiments of inventive concepts.

FIG. 27 is a block diagram illustrating an electronic device including a semiconductor device according to example embodiments.

Referring to FIG. 27, an electronic device 2000, according to an example, may include a communications unit 2010, an input unit 2020, an output unit 2030, a memory 2040, and a processor 2050.

The communications unit 2010 may include a wired/wireless communications module and may include a wireless Internet module, a short-range communications module, a global positioning system (GPS) module, a mobile communications module, and the like. The wired/wireless communications module included in the communications unit 2010 may be connected to an external communications network based on various communications standards in order to transmit and receive data.

The input unit 2020 may be provided to allow a user to control operations of the electronic device 2000, and may include a mechanical switch, a touch screen, a voice recognition module, and the like. In addition, examples of the input unit 2020 may include a trackball mouse, a laser pointer mouse, or a finger mouse, and may further include various sensor modules allowing the user to input data.

Information processed by the electronic device 2000 may be output in a form of audio or video by the output unit 2030, and the memory 2040 may store a program for processing and controlling operations of the processor 2050, or may store data. The processor 2050 may store or retrieve data by transmitting command to the memory 2040 according to the required operation.

The memory 2040 may be installed in the electronic device 2000 or communicate with the processor 2050 through a separate interface. When the memory 2040 communicates with the processor 2050 through a separate interface, the processor 2050 may store data in the memory 2040 or retrieve data therefrom through various interface standards such as SD, SDHC, SDXC, MICRO SD, USB, and the like.

The processor 2050 may control operations of respective units included in the electronic device 2000. The processor 2050 may perform controlling and processing related to audio calls, video calls, data communications, and the like, or controlling and processing for playing and managing of multimedia. In addition, the processor 2050 may process an input transmitted from the user through the input unit 2020 and output a corresponding result thereof through the output unit 2030. The processor 2050 may store data required to control operations of the electronic device 2000 in the memory 2040 or retrieve the data from the memory 2040. At least one of the processor 2050 and the memory 2040 may include a semiconductor device according to example embodiments described with reference to FIGS. 3 through 9.

Figure 28:
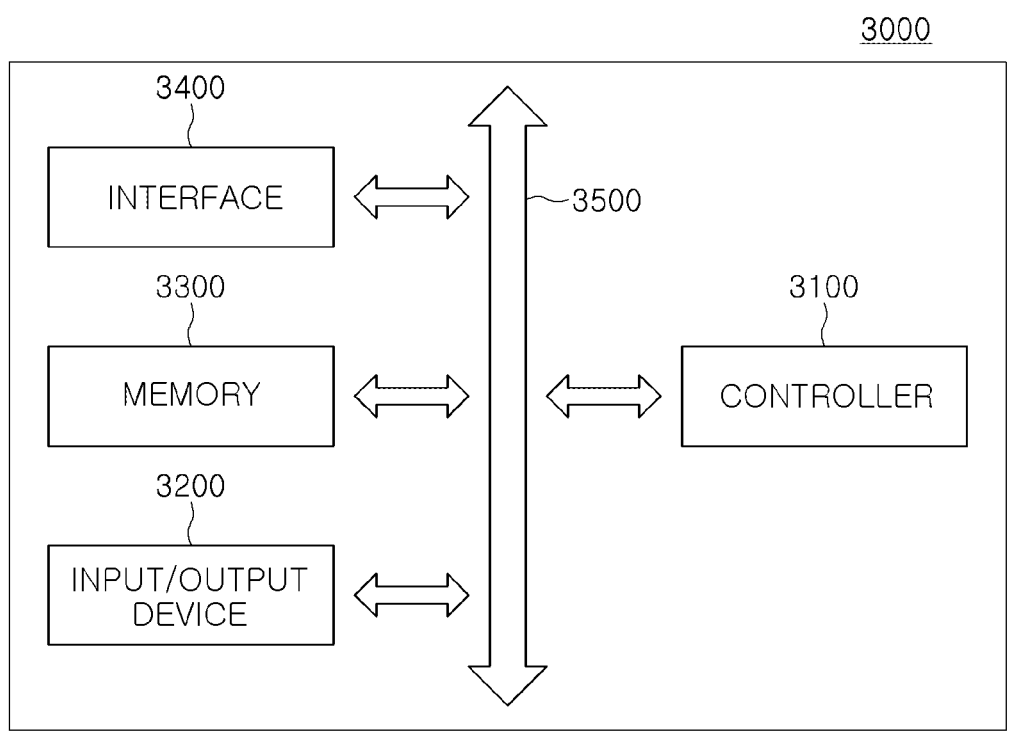
FIG. 28 is a block diagram illustrating a system including a semiconductor device according to example embodiments of inventive concepts.

FIG. 28 is a block diagram schematically illustrating a system including a semiconductor device according to example embodiments.

Referring to FIG. 28, a system 3000 may include a controller 3100, an input/output device 3200, a memory 3300, and an interface 3400. The system 3000 may be provided as a mobile system or a system transmitting or receiving information. The mobile system may be provided as a portable digital assistant (PDA), a portable computer, a web tablet, a wireless phone, a mobile phone, a digital music player, or a memory card.

The controller 3100 may execute a program and control the system 3000. The controller 3100 may be provided as, for example, a microprocessor, a digital signal processor, a microcontroller, or a device similar thereto.

The input/output device 3200 may be used in inputting or outputting data of the system 3000. The system 3000 may be connected to an external device such as a personal computer or a network using the input/output device 3200, and may exchange data with the connected external device. The input/output device 3200 may be provided as, for example, a keypad, a keyboard, or a display.

The memory 3300 may store a code for an operation of the controller 3100 and/or data, and/or store data processed by the controller 3100. The memory 3300 may include a semiconductor device according to example embodiments.

The interface 3400 may serve as a passage for data transmission between the system 3000 and an external device. The controller 3100, the input/output device 3200, the memory 33000, and the interface 3400 may communicate with each other through a bus 3500.

At least one of the controller 3100 and the memory 3300 may include a semiconductor device according to example embodiments described with reference to FIGS. 3 through 9.

As set forth above, according to example embodiments, a semiconductor device having improved reliability by forming an air gap having an open upper portion in the a conductive layer having a relatively high aspect ratio may be provided.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor device, comprising:
a substrate;
gate electrodes and interlayer insulating layers alternately stacked on the substrate;
channel regions penetrating through the gate electrodes and the interlayer insulating layers;
a conductive layer penetrating through the gate electrodes and the interlayer insulating layers,
the conductive layer being connected to the substrate and extending between two groups of the channel regions;
an insulating layer covering an upper surface of the conductive layer; and
a contact plug penetrating through the insulating layer and connected to the conductive layer, the contact plug, the insulating layer and an inner sidewall of the conductive layer defining an air gap in the conductive layer.

2. The semiconductor device of claim 1, wherein the air gap is open to the upper surface of the conductive layer.

3. The semiconductor device of claim 1, wherein the air gap extends toward the substrate along the conductive layer from an upper portion of the conductive layer.

4. The semiconductor device of claim 1, wherein the contact plug contacts the conductive layer on both sides of the air gap.

5. The semiconductor device of claim 1, wherein
the gate electrodes and the interlayer insulating layers define an open portion that exposes the substrate,
the conductive layer extends into the open portion, and
the air gap is formed in the conductive layer in the open portion.

6. The semiconductor device of claim 1, further comprising:
a plurality of contact plugs, wherein
the conductive layer extends linearly in one direction,
the plurality of contact plugs include the contact plug, and
the plurality of the contact plugs are spaced apart from each other on the conductive layer.

7. The semiconductor device of claim 1, wherein a width of the contact plug is narrower than an overall width of the conductive layer on the upper surface of the conductive layer.

8. The semiconductor device of claim 1, wherein the contact plug is in a recessed portion of the conductive layer.

9. The semiconductor device of claim 1, wherein the contact plug extends to an inside of the air gap such that a lower surface of the contact plug is positioned at a height lower than a height of the upper surface of the conductive layer.

10. The semiconductor device of claim 1, wherein a lower end of the air gap is spaced apart from an upper surface of the substrate.

11. The semiconductor device of claim 10, wherein a height from the upper surface of the substrate to the lower end of the air gap is equal to 15% or more of a height of the conductive layer.

12. The semiconductor device of claim 1, further comprising:
a dielectric layer on the upper surface of the conductive layer, wherein
the dielectric layer is exposed through the air gap.

13. The semiconductor device of claim 1, wherein the conductive layer has a shape in which a width of the conductive layer decreases in proximity to the substrate.

14. The semiconductor device of claim 1, wherein
a width of the conductive layer increases from the upper surface of the conductive layer to a point at an intermediate depth, and
the width of the conductive layer decreases from the point at the intermediate depth toward the substrate.

15. A semiconductor device, comprising:
a substrate;
a plurality of memory strings spaced apart from each other on the substrate,
the memory strings including two groups of memory strings that are spaced apart from each other,
each of the memory strings including a string selection transistor on a ground selection transistor, and a plurality of memory cells stacked on top of each other between the ground selection transistor and the string selection transistor;

a conductive layer between the two groups of memory strings, the conductive layer including a trench formed in the conductive layer that opens to a top of the conductive layer and has a depth less than a total height of the conductive layer; and a contact plug on the conductive layer, the contact plug covering the trench and spaced apart from a bottom of the trench to define an air gap surrounded by the conductive layer.

16. The semiconductor device of claim 15, further comprising:

an insulating layer between the two groups of memory strings, wherein the insulating layer defines an open portion that exposes the substrate, and the conductive layer and the air gap are positioned in the open portion.

17. The semiconductor device of claim 15, wherein a bottom of the contact plug extends partially into the trench such that the bottom of the contact plug is below an upper surface of the conductive layer.

18. The semiconductor device of claim 15, further comprising:

a dielectric layer covering inner sidewalls of the conductive layer in the trench, wherein the dielectric layer is between the contact plug and the bottom of the trench.

19. The semiconductor device of claim 15, wherein a width of the air gap is greater at an intermediate portion of the air gap than the width of the air gap at a top portion of the air gap, and the width of the air gap is greater at the intermediate portion than the width of the air gap at a bottom of the air gap.

* * * * *